(12) United States Patent
Middlebrooks et al.

(10) Patent No.: US 11,067,901 B2
(45) Date of Patent: Jul. 20, 2021

(54) METHOD AND APPARATUS FOR IMAGE ANALYSIS

(71) Applicant: ASML NETHERLANDS B.V., Veldhoven (NL)

(72) Inventors: Scott Anderson Middlebrooks, Duizel (NL); Adrianus Cornelis Matheus Koopman, Hilversum (NL); Markus Gerardus Martinus Maria Van Kraaij, Eindhoven (NL); Maxim Pisarenco, Son en Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 190 days.

(21) Appl. No.: 16/464,705

(22) PCT Filed: Nov. 29, 2017

(86) PCT No.: PCT/EP2017/080774
§ 371 (c)(1),
(2) Date: May 29, 2019

(87) PCT Pub. No.: WO2018/108528
PCT Pub. Date: Jun. 21, 2018

(65) Prior Publication Data
US 2019/0310554 A1    Oct. 10, 2019

(30) Foreign Application Priority Data

Dec. 16, 2016    (EP) ..................................... 16204832

(51) Int. Cl.
*G06K 9/00* (2006.01)
*G03F 7/20* (2006.01)
(Continued)

(52) U.S. Cl.
CPC .......... *G03F 7/705* (2013.01); *G03F 7/70525* (2013.01); *G06T 7/0004* (2013.01); *G06T 7/143* (2017.01); *G06T 7/149* (2017.01)

(58) Field of Classification Search
CPC .... G01S 5/22; G06Q 90/205; G08B 13/1672; G08B 13/19619; G08B 13/19656;
(Continued)

(56) References Cited

U.S. PATENT DOCUMENTS

| 2009/0231562 A1 | 9/2009 | Yoshii et al. |
| 2009/0300573 A1 | 12/2009 | Cao et al. |
| 2015/0149971 A1 | 5/2015 | Apostol et al. |

FOREIGN PATENT DOCUMENTS

| TW | 201011473 | 3/2010 |
| WO | 2012016243 | 2/2012 |

OTHER PUBLICATIONS

International Search Report and Written Opinion issued in corresponding PCT Patent Application No. PCT/EP2017/080774, dated Feb. 16, 2018.

(Continued)

*Primary Examiner* — Charlotte M Baker
(74) *Attorney, Agent, or Firm* — Pillsbury Winthrop Shaw Pittman LLP

(57) ABSTRACT

A method including: obtaining a logistic mathematical model predicting the formation of a physical structure created using a patterning process; evaluating the logistic mathematical model to predict formation of a part of the physical structure and generate an output; and adapting, based on the output, an aspect of the patterning process.

20 Claims, 14 Drawing Sheets

(51) Int. Cl.
    *G06T 7/143* (2017.01)
    *G06T 7/149* (2017.01)
    *G06T 7/00* (2017.01)

(58) Field of Classification Search
    CPC ..... G03F 7/705; G03F 7/70525; G06T 7/143; G06T 7/149; G06T 7/0004
    USPC ..... 382/144; 707/999.102, E17.005; 716/55, 716/50; 355/53, 67
    See application file for complete search history.

(56) References Cited

OTHER PUBLICATIONS

Taiwanese Office Action issued in corresponding Taiwanese Patent Application No. 106143866, dated Jan. 8, 2019.

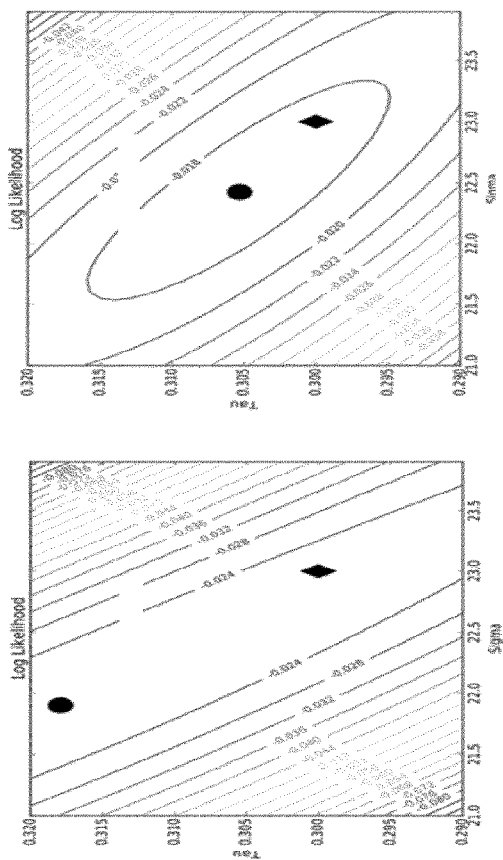
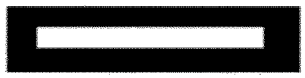
Fig. 9A  Fig. 9B
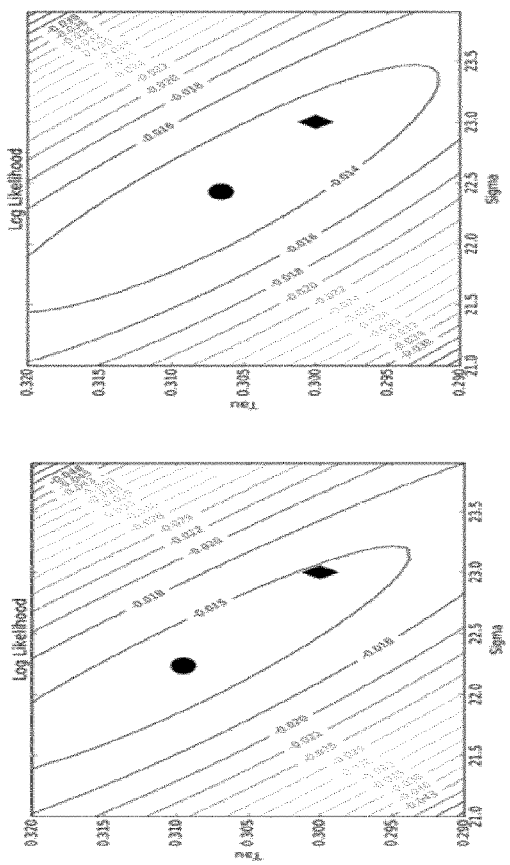
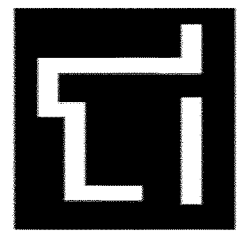
Fig. 9C  Fig. 9D

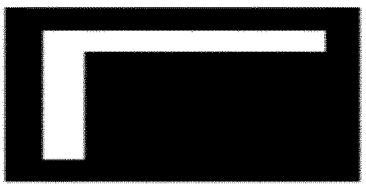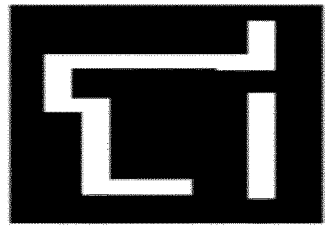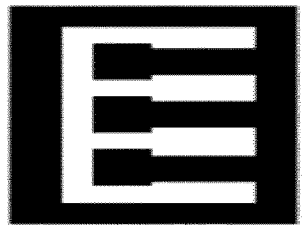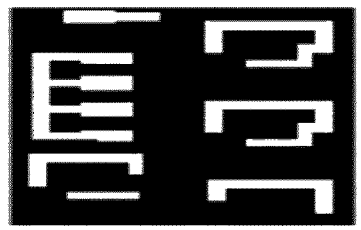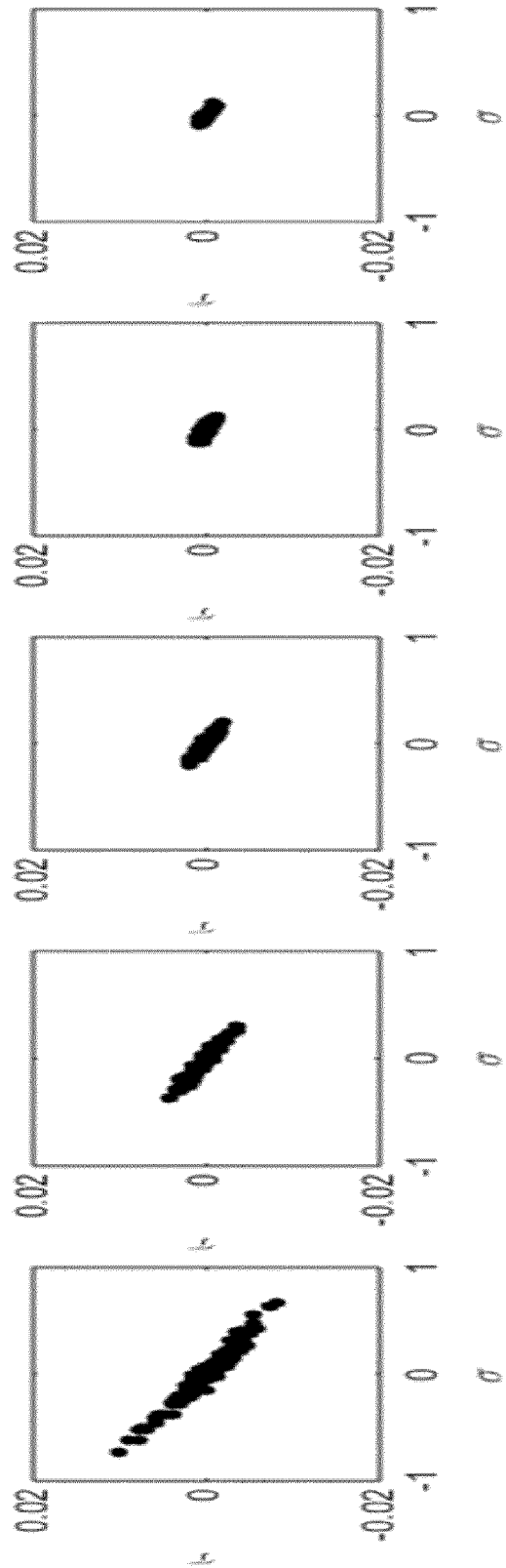
Fig. 10A  Fig. 10B  Fig. 10C  Fig. 10D  Fig. 10E

METHOD AND APPARATUS FOR IMAGE ANALYSIS

CROSS-REFERENCE TO RELATED APPLICATION

This application is the U.S. national phase entry of PCT Patent Application No. PCT/EP2017/080774, which was filed on Nov. 29, 2017, which claims the benefit of priority of European Patent Application No. 16204832.6, which was filed on Dec. 16, 2016 and which is incorporated herein in its entirety by reference.

FIELD

The present description relates to methods and apparatus for detection, registration and high-resolution quantification of images.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters/variables of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Errors, such as overlay errors, CD errors, etc., will inevitably be produced in the patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in etch, development, bake, etc. and similarly can be characterized in terms of, e.g., overlay errors, CD errors, etc. The errors may directly cause a problem in terms of the functional of the device, including failure of the device to function or one or more electrical problems of the functioning device.

As noted above, in patterning processes, it is desirable to frequently make measurements of the structures created, e.g., for process control and verification. One or more parameters of the structures are typically measured or determined, for example the critical dimension of a structure, the overlay error between successive layers formed in or on the substrate, etc. There are various techniques for making measurements of the microscopic structures formed in a patterning process. Various tools for making such measurements are known including, but not limited to, scanning electron microscopes (SEMs), which are often used to measure critical dimension (CD). SEMs have high resolving power and are capable of resolving features of the order of 50 nm, 10 nm or less. SEM images of semiconductor devices are often used in the semiconductor fab to observe what is happening at the device level.

The information contained in SEM images of device structures can be used for process modeling, existing model calibration, defect detection, estimation or classification, yield estimation, process control or monitoring, etc. Such SEM images may be processed to extract contours that describe the edges of objects, representing device structures, in the image. These contours are then quantified via metrics, such as CD, at user-defined cut-lines. Thus, typically, the images of device structures are compared and quantified via simplistic metrics, such as an edge-to-edge distance (CD) measured on extracted contours or simple pixel differences between images. These simplistic metrics may not allow for the identification of accurate and descriptive multivariate models and thus, e.g., not allow precise control of yield.

To enable, for example, improved model identification, defect detection, process control, etc., it is desirable to provide a technique to process one or more images of one or more structures created using a patterning process and arrive at a model that predicts a resulting pattern (e.g., post-development, post-etch, etc.) from a design pattern used in the patterning process. With such a model, for example, it can be determined whether there is a defect expected or not expected. Additionally, it may be desirable to identify in the image where an expected defect occurs. The defects may include thinning or necking (e.g., line thinning or necking), bridging or shorting, an opening or disconnect, pullback (e.g., line end pullback), etc. One or more of these defects may be yield-damaging faults. Further, the model can be used for process control, e.g., based on a predicted CD derived from the model.

In an embodiment, there is provided a method comprising: obtaining a logistic mathematical model predicting the formation of a physical structure created using a patterning process; evaluating, by a hardware computer, the logistic mathematical model to predict formation of a part of the physical structure and generate an output; and adapting, based on the output, an aspect of the patterning process.

In an embodiment, there is provided a method comprising: obtaining a measured image of a physical structure created using a patterning process; and using, by a hardware computer, individual pixels of the image as independent outcomes to parameterize a mathematical model predicting the formation of a part of a physical structure created using the patterning process.

In an embodiment, there is provided a method comprising: obtaining a combination mathematical model comprising a plurality of classifier models determined by a boosting machine learning algorithm, the combination mathematical model predicting formation of a physical structure created using a patterning process; evaluating, by a hardware computer, the combination mathematical model to predict formation of a part of the physical structure and generate an output; and adapting, based on the output, an aspect of the patterning process.

In an embodiment, there is provided a method comprising: obtaining a measured image of a physical structure created using a patterning process; and performing, by a hardware computer, a boosting machine learning algorithm to parameterize a plurality of classifier models, the boosting machine learning algorithm using values of pixels of the measured image as outcomes and a combination of the classifier models predicting the formation of a part of a physical structure created using the patterning process.

In an aspect, there is provided a method of manufacturing devices wherein a device pattern is applied to a series of substrates using a patterning process, the method including evaluating a design pattern, for processing using the patterning process, using the method as described herein and controlling the patterning process for one or more of the substrates in accordance with the result of the method.

In aspect, there is provided a non-transitory computer program product comprising machine-readable instructions configured to cause a processor to cause performance of a method described herein.

In an aspect, there is provided a system comprising: a scanning electron microscope configured to provide an image of a lithographically created structure; and an image analysis engine comprising the non-transitory computer program product described herein. In an embodiment, the system further comprises a lithographic apparatus comprising a support structure configured to hold a patterning device to modulate a radiation beam and a projection optical system arranged to project the modulated onto a radiation-sensitive substrate.

BRIEF DESCRIPTION OF THE DRAWINGS

Embodiments will now be described, by way of example only, with reference to the accompanying drawings in which:

FIGS. 9A, 9B, 9C and 9D show examples of covariance of model parameters for different design patterns;

FIGS. 10A, 10B, 10C, 10D and 10E show examples of covariance of model parameters for different design patterns;

DETAILED DESCRIPTION

Before describing embodiments in detail, it is instructive to present an example environment in which embodiments may be implemented.

Figure 1:
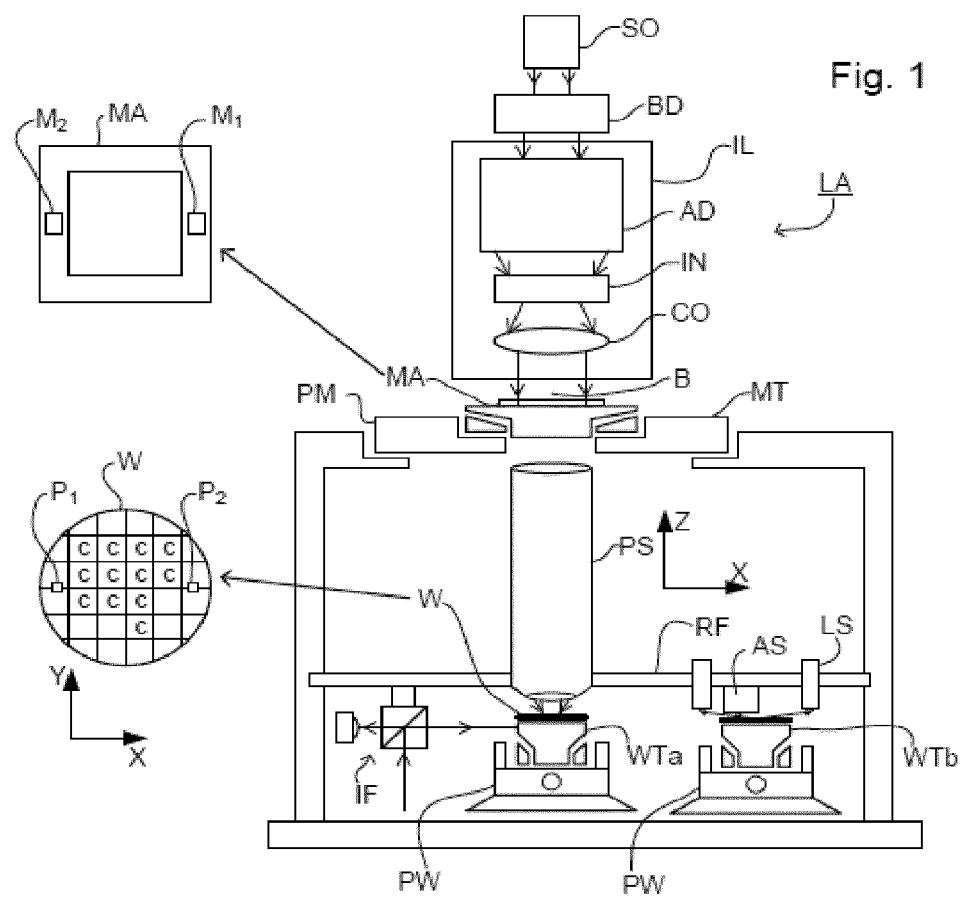
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for pattern transfer.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different patterning or other process conditions than adjacent features. An embodiment of an alignment system, which detects the alignment markers, is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
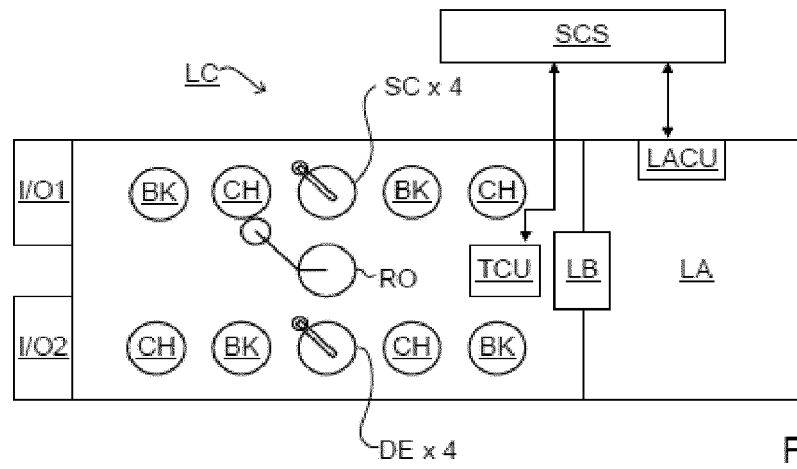
FIG. 2 schematically depicts an embodiment of a lithographic cell or cluster.

As shown in FIG. 2, a lithographic apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop patterned resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is processed (e.g., exposed) by the lithographic apparatus is processed correctly and consistently, it is desirable to inspect a processed substrate to measure one or more properties such as overlay error between subsequent layers, line thickness, critical dimension (CD), etc. If an error is detected, an adjustment may be made to processing of one or more subsequent substrates. This may particularly useful, for example, if the inspection can be done soon and fast enough that another substrate of the same batch is still to be processed. Also, an already processed substrate may be stripped and reworked (to improve yield) or discarded, thereby avoiding performing a pattern transfer on a substrate that is known to be faulty. In a case where only some target portions of a substrate are faulty, a further pattern transfer may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the patterned resist layer immediately after pattern transfer. However, the latent pattern in the resist may have a very low contrast—e.g., there is only a very small difference in refractive index between the part of the resist which has been exposed to radiation and that which has not—and not all inspection apparatus have sufficient sensitivity to make useful measurements of the latent pattern. Therefore measurements may be taken after a post-exposure bake step (PEB) which is customarily the first step carried out on a patterned substrate and increases the contrast between, e.g., exposed and unexposed parts of the resist. At this stage, the pattern in the resist may be referred to as semi-latent. It is also possible to make measurements of the developed resist image—at which point, e.g., either the exposed or unexposed parts of the resist have been removed—or after a pattern transfer step such as etching. The latter possibility limits the possibility for rework of a faulty substrate but may still provide useful information, e.g. for the purpose of process control.

Figure 3:
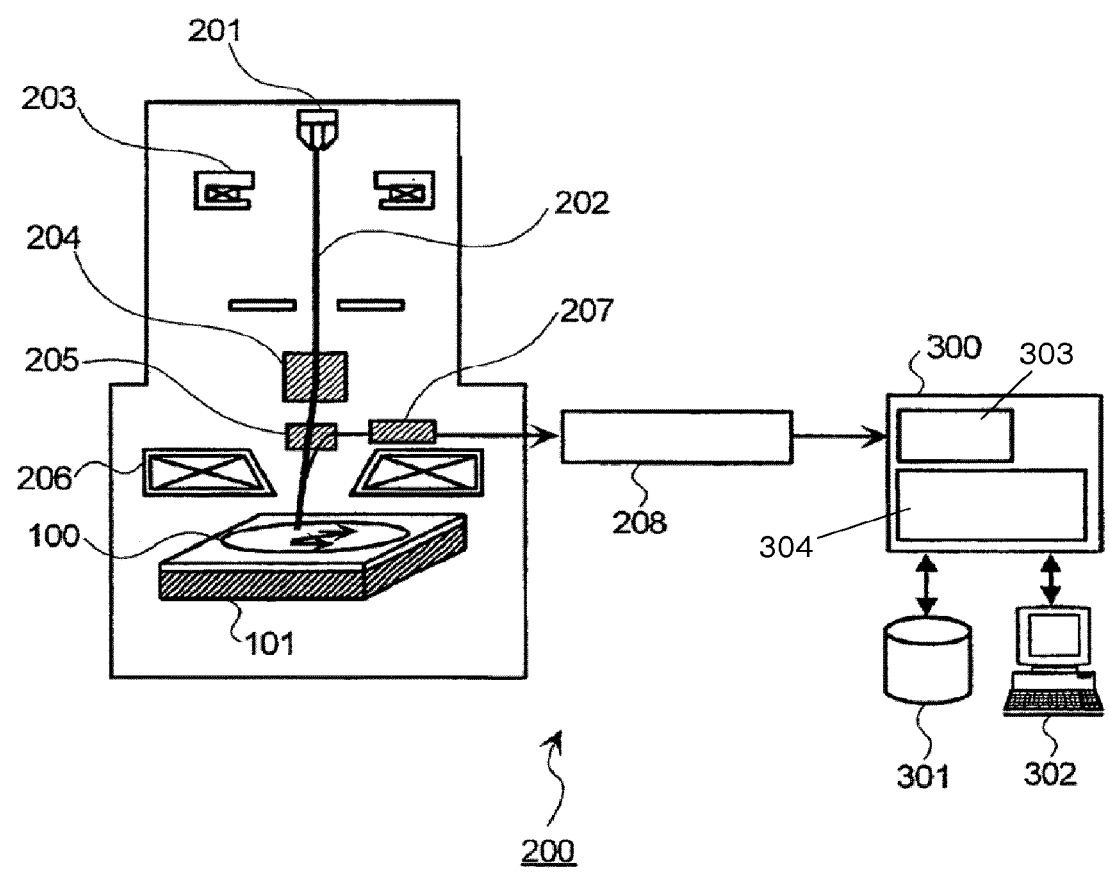
FIG. 3 schematically depicts an embodiment of a scanning electron microscope (SEM)

In some embodiments, the inspection apparatus may be a scanning electron microscope (SEM) that yields an image of a structure (e.g., some or all the structure of a device) exposed or transferred on the substrate. FIG. 3 depicts an embodiment of a SEM 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction.

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other patterning processes, the structure may be a device or a portion thereof that is being manufactured and the images may be SEM images of the structure. In some instances, the structure may be a feature of semiconductor device, e.g., integrated circuit. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

Figure 4:
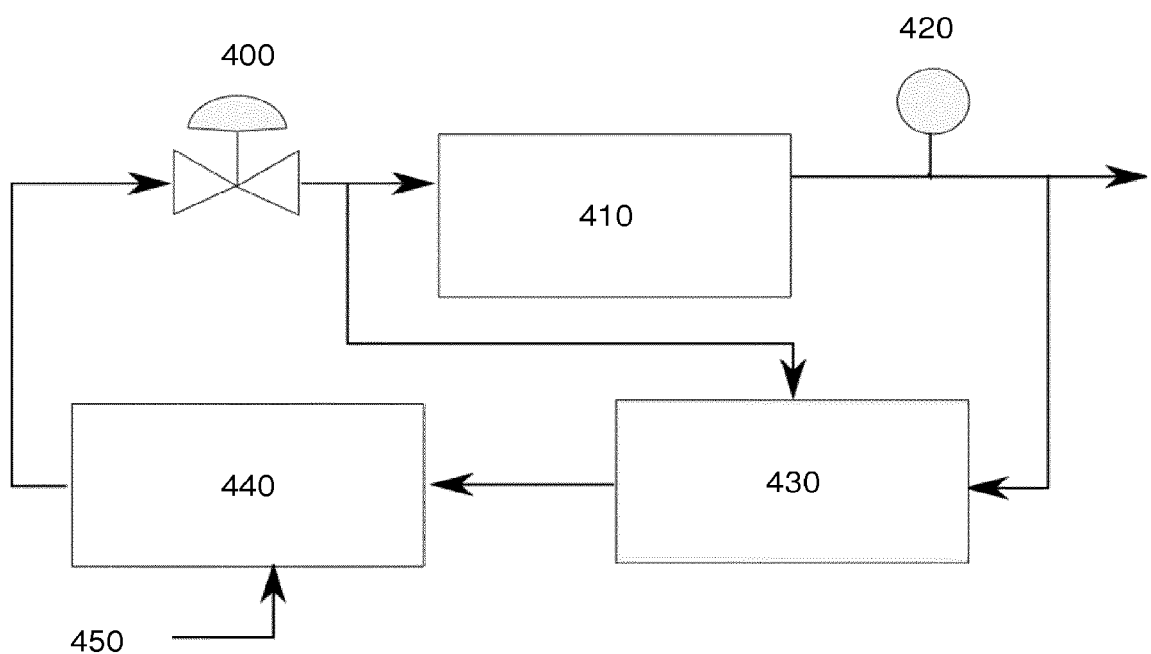
FIG. 4 schematically depicts an overview of an example model prediction system according to an embodiment.

Referring to FIG. 4, an overview of an example model prediction system according to an embodiment is depicted. In an embodiment, the system of FIG. 4 is an adaptive state estimation and model predictive control system for a patterning process (e.g., both the lithographic and etch processes of a patterning process). In the following discussion, the model prediction system (and associated techniques) will be described in relation to a patterning process involving an optical lithographic process. In another embodiment, a different patterning process can be used, e.g., one involving imprint lithography. And so, for such a different patterning process, one or more different parameters/variables may be involved as would be appreciated by those skilled in the art.

At 400, certain inputs to the model prediction are provided. For example, nominal values of focus, dose, optical aberration, illumination mode (e.g., spatial distribution, such as an annular, dipole, quadrupole, etc.), etc. of the patterning process can be input. Further, a design pattern to produce the structure using the patterning process is input. In a typical embodiment, the design pattern is a patterning device (e.g., mask) pattern. In combination, the input values define a particular patterning process. As will be appreciated a different combination of parameters/variables can define a different patterning process.

At 410, a mathematical model of at least part of the patterning process receives the inputs. The model produces an output 420 as further described below. In an embodiment, the model can predict the structure, as produced using the patterning process, as a latent image in a resist. In an embodiment, the model can predict the structure, as produced using the patterning process, as an image in the resist after development of the resist but before etch. In an embodiment, the model can predict the structure, as produced using the patterning process, after etch. As will be discussed more hereafter, in an embodiment, the model is a logistic model that predicts an on-product pattern shape after, e.g., a lithography step of the patterning process or after an etch step of the patterning process.

At 420, the model produces one or more outputs that reflect the prediction of the structure being produced using the patterning process. In an embodiment, the output is a predicted image of the structure predicted to be produced using the patterning process. In an embodiment, the output is a predicted parameter (e.g., CD) pertaining to the image or the structure predicted to be produced using the patterning process.

At 430, a state of the model can be estimated. In an embodiment, on-product measurements of the pattern shape as actually produced using the patterning process can be used to identify the model (e.g., a logistic model) and estimate its parameters. Via state estimation, the model can be, in an embodiment, continually and recursively updated such that model predictions match a measured output as the patterning process runs. This is advantageous as there will likely be a mismatch between an open-loop model prediction and measured reality; for example, a lithographic apparatus behaving differently than expected, an etch tool behaving differently than expected, a process drift, other disturbances, etc. can cause such a mismatch. The mismatch deteriorate yield of the patterning process and so, in an embodiment, is estimated during the execution of patterning process in order to control the patterning process. As seen, in FIG. 4, the estimation of the state at 430 can take as inputs the predicted output from the model 420 and one or more of the patterning process inputs 400. The estimation of the state at 430 can produce one or more parameters of the mathematical model 410. In an embodiment, the estimation of the state at 430 can receive as an input a measurement of one or more patterning process disturbances.

At 440, the model prediction system can regulate the pattern output to one or more targets 450. The one or more targets 450 may specify a certain desired value of a parameter/variable (e.g., a desired CD, etc.). The regulator at 440 can produce an appropriate change or correction to one or more inputs 400 to the model prediction system.

Figure 5:
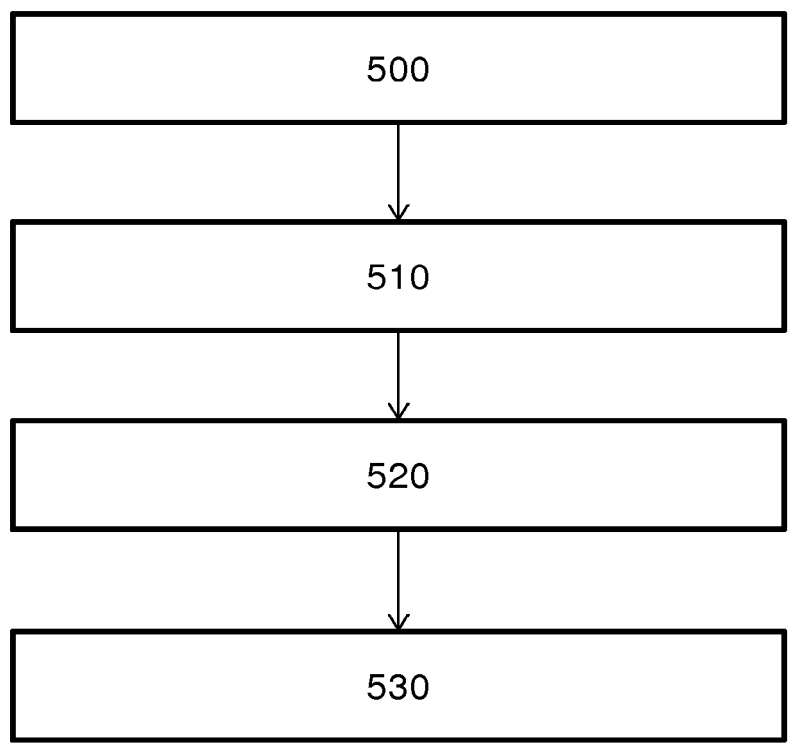
FIG. 5 depicts an example process of creating and applying a model prediction system.

Referring to FIG. 5, an example process of creating and applying a model prediction system is depicted. As noted above, at 500, a mathematical model of at least part of the patterning process is proposed. In an embodiment, the model is a logistic model that predicts an on-product pattern shape after, e.g., a lithography step of the patterning process or after an etch step of the patterning process At 510, on-product measurements of an actually produced pattern shape in accordance with the patterning process are used to identify the mathematical model (e.g., the logistic model) and estimate one or more parameters of the terms of the mathematical model.

At 520, via state estimation, the model is updated (e.g., continually and recursively in conjunction with executions of the patterning process) such that model predictions match measured outputs as the patterning process runs.

At 530, the model prediction system is used to regulate the pattern output of the patterning process to one or more targets as discussed above.

Figure 6:
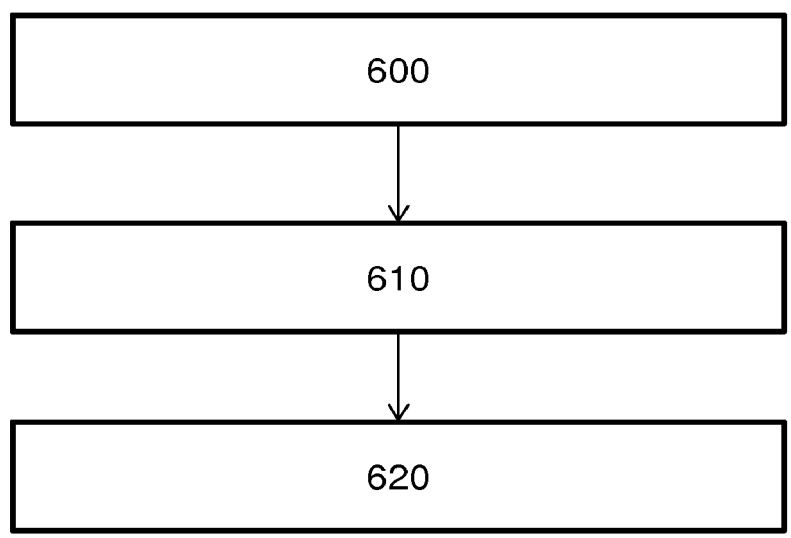
FIG. 6 depicts an example process of deriving a model for the model prediction system.

Now, referring to FIG. 6, an example process of deriving a mathematical model that predicts a resulting pattern (e.g., post-development, post-etch, etc.) from a design pattern used in a patterning process. In an embodiment, the model is for the model prediction system as depicted in FIG. 4.

At 600, a design pattern is obtained and used to compute an aerial image of the design pattern. So, in an embodiment, there is provided a given design pattern m(x,y) and then an aerial image a(x,y) is computed therefrom, wherein x and y are the coordinates in the plane of the image. An example of a design pattern is depicted as FIG. 7A. In an embodiment, there is provided a design pattern m(x,y) wherein m∈{0,1} (binary) such as depicted at the left hand side of FIG. 8A along with a detail of part of the design pattern to the right. In an embodiment, the patterning device can be a phase shift mask in which case the design pattern m(x,y) would be appropriately configured.

Figure 7A:
FIGS. 7A, 7B, 7C and 7D depict examples of a design pattern, an aerial image, a probability map and a resist image.
Figure 7B:
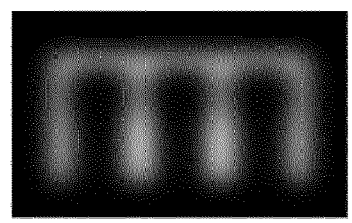
Figure 8A:
FIGS. 8A, 8B, 8C and 8D depict examples of a design pattern, an aerial image, a probability map and a resist image.
Figure 8A:
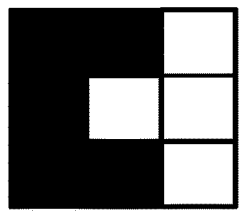

In an embodiment, the aerial image a(x,y) is computed as a convolution of the given design pattern m(x,y) with a point spread function (PSF) that describes the projection of a pattern onto a substrate (e.g., describes the projection and illumination system of a lithographic apparatus). In an embodiment, the aerial image has the form:

$$a(x,y)=|(h*m)(x,y)|^2 \quad (1)$$

wherein h describes the point spread function and m corresponds to the design pattern, in x, y. In an embodiment, the aerial image a∈[0, A]. In an embodiment, the point spread function can be a single Gaussian in the form of, e.g.:

$$h(x, y) = \frac{1}{2\pi\sigma^2} \cdot e^{-\frac{x^2+y^2}{2\sigma^2}} \quad (2)$$

wherein parameter σ models de-focus. An example of a computed aerial image of the design pattern on FIG. 7A is depicted as FIG. 7B. An example of the aerial image corresponding to the design pattern of FIG. 8A is shown to the left in FIG. 8B along with a detail of part of the aerial image to the right. The aerial image can take other forms (e.g., calculated in a different manner). In an embodiment, the aerial image can be generated by more than one point-spread source that is combined into one aerial image. In an embodiment, an illumination mode (e.g., spatial and/or angular distribution), such as a free-form illumination distribution, is also included in the model.

At 610, there is computed a probability map P(x,y) which is the probability of the creation (or not) of a portion of the structure. In an embodiment, the probability is the probability of development, or no development, of a portion of a resist subsequent to development of the resist as part of a patterning process. In an embodiment, the probability is the probability of post-etch formation, or no post-etch formation, of a portion of a substrate after etch using a patterned resist as part of a patterning process. The discussion herein focuses on a post-development resist model but the model can be used to model other parts of the patterning process, such as a post-etch model.

Figure 7C:
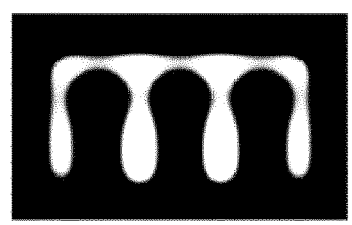
Figure 8B:
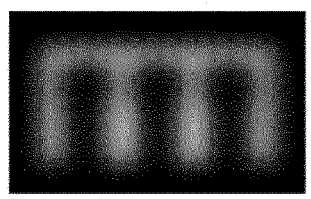
Figure 8B:
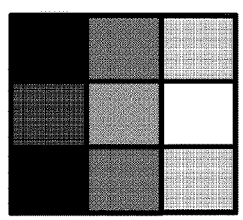
Figure 8C:
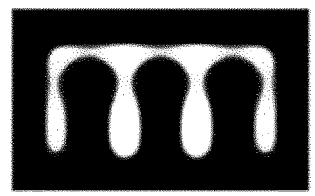
Figure 8C:
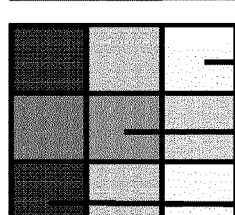
Figure 8C:
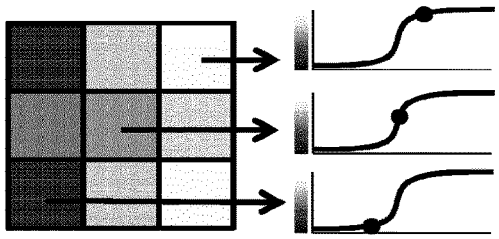

It has been discovered that a logistic model/function can be used to accurately predict the response in parts (e.g., pixels) of an image of a physical structure produced using a patterning process. Thus, in an embodiment, the aerial image can be transformed to a probability map in the form of a logistic model. For example, the logistic model can represent a post-development resist model or a post-etch model. In an embodiment, the logistic model can be any logistic function having any number of features/regressors and any number of parameters. In an embodiment, in the context of a resist model, the aerial image is projected to a logistic model comprising a sigmoid function in the form of, e.g.:

$$P(x, y) = \frac{1}{1 + e^{-\gamma(a(x,y)-\tau)}} \quad (3)$$

wherein P(x,y) is the probability of developing, or not developing, the resist, a(x,y) is the aerial image as described above, γ determines the slope of the sigmoid and is proportional to resist sensitivity, and τ is the threshold that determines the a for which P=0.5 (equal probability of being developed or not developed). Thus, in an embodiment, the probability P∈[0,1]. In this example, the maximum value of the logistic model is 1, in which case τ is the threshold that determines the a for which P is half of that maximum value. An example of a computed probability map based on the aerial image of FIG. 7B is depicted as FIG. 7C. An example of the probability map derived from the aerial image of FIG. 8B is shown to the left in FIG. 8C along with a detail of part of the probability map to the right. Also FIG. 8C shows how the probability of different pixels corresponds to particular locations on a graph corresponding to the logistic model. So, it can be seen how different portions have different probabilities ranging from 0 to 1.

As described further hereafter, the set θ of parameters of the model can be determined by evaluating one or more images of actually produced structures; for example, in the case of equation (3), θ=[σ, γ, τ]. In particular, in an embodiment, individual pixels of the image are used as independent outcomes to parameterize the mathematical model. Thus, in an embodiment, the parameters are determined to create a probabilistic model that fits pixels of an image of a measured physical structure.

So, in an embodiment, a probabilistic model that fits pixels of a binarized image (wherein pixels have a value of 0 or 1) of a measured physical structure can have a generalized form of, e.g.:

$$p(z_i = 1 \mid \theta) = \frac{1}{1 + e^{-(\theta_2 \cdot |m*h(\theta_1)|^2 + \theta_3)}} \quad (4)$$

wherein $z_i$ corresponds to a pixel at $(x_i, y_i)$ in the image, θ corresponds to values of the parameters $\theta_1$, $\theta_2$ and $\theta_3$ of the model, and $|m*h(\theta_1)|^2$ corresponds to the blur of the aerial image of the design pattern m arising from the lithographic projection of the design pattern wherein $h(\theta_1)$ is, e.g., a point spread function of the form of equation (2) wherein $\theta_1$ corresponds to parameter a. Much of the discussion in this document focuses on using a binary configuration, e.g., pixels in binary form. However, in other embodiments, a different configuration can be used, e.g., more than 2 values such as gray scale values.

Besides blur of the design pattern, one or more additional or other regressor quantities/features can be evaluated as part of the logistic model. For example, the strain in the physical structure as represented in the image can be evaluated as a regressor quantity. In an embodiment, the strain s can have the form of:

$$s(x,y) = \det(\text{Hess}(f(x,y))) \quad (5)$$

wherein f(x,y) is some function $\mathbb{R}^2 \to \mathbb{R}$ such as the aerial image. A further regressor is "Gaussian curvature", which is closely related to strain, in the example form of:

$$k(x, y) = \frac{\det(\text{Hess}(f(x, y)))}{|\nabla f|^4} \quad (6)$$

As another example, the mean curvature in the physical structure as represented in the image can be evaluated as a regressor quantity. In an embodiment, the mean curvature c can have the form of:

$$c(x, y) = \frac{\nabla F \, \text{Hess}(F) \nabla F^T - |\nabla F|^2 \text{Trace}(\text{Hess}(F))}{2|\nabla F|^3} = -\frac{1}{2} \nabla \cdot \left( \frac{\nabla F}{|\nabla F|} \right) \quad (7)$$

wherein F(x,y,z)=z−f(x,y), wherein f(x,y) corresponds to the aerial image.

In an embodiment, the logistic model incorporating design pattern blur can be extended by introducing curvature therein. Thus, in an embodiment, a probabilistic model that fits pixels of a binarized image (wherein pixels have a value of 0 or 1) of a measured physical structure can have the form of, e.g.:

$$P(z_i = 1 \mid \theta) = \frac{1}{1 + e^{-(\theta_2 \cdot |m*h(\theta_1)|^2 + \theta_3 + \theta_5 \cdot C(|m*h(\theta_4)|^2))}} \quad (8)$$

wherein θ corresponds to values of the parameters $\theta_1$, $\theta_2$, $\theta_3$, $\theta_4$, and $\theta_5$ of the model (thus extended to 5 parameters from the earlier 3 parameter model), $|m*h(\theta_1)|^2$ corresponds to the blur of the aerial image of the design pattern m when produced in the resist, and $C(|m*h(\theta_4)|^2)$ corresponds to the curvature of the aerial image of the design pattern m when produced in the resist. In an embodiment, the logistic model of equation (8) can be extended to the form:

$$P(z_i = 1 \mid \theta) = \frac{1}{1 + e^{-\left(\theta_2 \cdot |m*h(\theta_1)|^2 + \theta_3 + \theta_5 \cdot C((|m*h(\theta_4)|^2)^{\beta_6})\right)}} \quad (9)$$

Figure 7D:
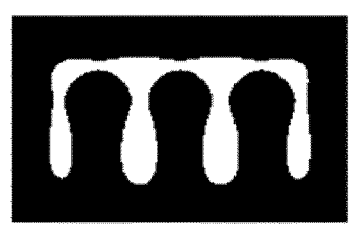
Figure 8D:
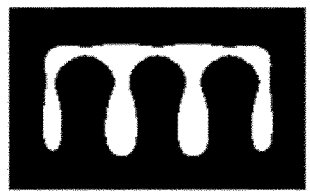
Figure 8D:
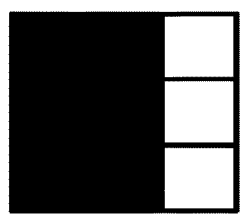
Figure 8D:

Having the logistic model, a resist image r(x,y) can be computed from the probability map P(x,y). For example, in an embodiment, the resist image r(x,y)=(P>0.5)=H(P−0.5), wherein H is a Heavyside step function. In an embodiment, the resist image r∈{0,1}(binary). So, the resist image can be generated from a realization coming from the probabilities and/or a simple Heaviside as described above. Further, while in this embodiment the threshold is 0.5, a different threshold can be used. An example of a computed resist image based on the probability map of FIG. 7C is depicted as FIG. 7D. An example of the resist image derived from the probability map of FIG. 8C is shown to the left in FIG. 8D along with a detail of part of the resist image to the right. Also FIG. 8D shows how a threshold can applied to the probability of different pixels (e.g., the dotted line in the graph) such that certain pixels are designated as 0 and others are designated as 1 depending on whether the corresponding pixel in the probability map exceeds or is below the threshold.

As noted above, the parameters θ should be estimated for a particular patterning process. To do so, in an embodiment, a measurement of a physical structure produced using the patterning process is used estimate the model parameters (i.e., to parameterize the model). In an embodiment, the measurement comprises an image of a physical structure. In an embodiment, the image comprises a SEM image of the physical structure. In an embodiment, the image is binarized (e.g., the pixels of the image are designated either a first value (e.g., 1) or a second value (e.g., 0).

To parameterize the mathematical model predicting the formation of a part of a physical structure created using the patterning process, the individual pixels of the image are used as independent outcomes to parameterize the mathematical model. That is, in an embodiment, each pixel can be assumed as conditionally independent. So, the prediction of a value of each pixel of a plurality of pixels of a measured image of the physical structure can be compared to the measured value of that pixel to arrive at an estimate of the parameters of the model. In particular, in an embodiment, a set of parameters can be found that maximizes the likelihood that a predicted value of a pixel corresponds to the measured value of the pixel. As will be appreciated, this analysis can be performed for a plurality of images for a same design pattern or for images of a plurality of different design patterns.

So, in an embodiment, given the design pattern m(x,y) and a measured image $z^m(x,y)$ (that in this case is a pixelated binarized image with pixels having values of 0 or 1) wherein the superscript m corresponds to measured, the parameter set θ of model are determined. For example, using the logistic mathematical model of equation (3), the analysis can take the form of:

$$P(z_i = 1 \mid \theta) = \frac{1}{1 + e^{-\gamma(|h*m|^2 - \tau)}}, \theta = \begin{bmatrix} \sigma \\ \gamma \\ \tau \end{bmatrix} \quad (10)$$

So, the output of the model, evaluated at a given pixel $z_i$ at $(x_i, y_i)$, is the probability P of that pixel being "on" (in this case, the value of 1), conditioned on a value of the set of parameters θ. So, if $z_i$ is a binary random variable that follows a binomial distribution, B(1, P), each pixel output of the model can be interpreted as a random variable from a binomial distribution. So, given the determined P for a particular pixel and a measurement of the pixel, the likelihood per pixel can be described as:

$$P(z_i = z_i^m \mid \theta) = P(z_i = 1 \mid \theta)^{z_i^m}(1 - P(z_i = 1 \mid \theta))^{1 - z_i^m} \quad (11)$$

So, the likelihood for the entire image (assuming each pixel is conditionally independent) can be described as:

$$P(z = z^m \mid \theta) = \Pi_i P(z_i = z_i^m \mid \theta) \quad (12)$$

Parameter estimates are determined that maximize this likelihood, either alone or conditioned with a prior likelihood such as:

$$\hat{\theta} = \mathrm{argmax}_\theta P(z^m \mid \theta) P(\theta) \quad (13)$$

Now, certain design patterns will observe the model parameters better. So, it would be useful to analyze how well the model parameters can be observed given the measurements of certain physical product structures. Indeed, certain design patterns will observe some model parameters better than others. This observability manifests itself as a covariance in the model parameter estimates. Observability manifests as a model parameter estimate error. FIGS. 9A, 9B, 9C and 9D show examples of estimate errors of model parameters for different design patterns. FIG. 9A shows a first example pattern to the left and an example corresponding log likelihood estimate between τ (along the vertical axis) and σ (along the horizontal axis) from equation (3) (which incorporates equations (1) and (2)). As seen in FIG. 9A, the contour lines are fairly spread out and do not strongly converge on a particular value of the log likelihood of each parameter. FIG. 9B shows a second example pattern to the left and a similar example corresponding log likelihood estimate between τ and σ. As seen in FIG. 9B, the contour lines are much more sharpened than in FIG. 9A and strongly converge on a particular value of the log likelihood of each parameter. FIG. 9C shows a third example pattern to the left and a similar example corresponding log likelihood estimate between τ and σ. Like in FIG. 9B, the contour lines are much more sharpened than in FIG. 9A and strongly converge on a particular value of the log likelihood of each parameter. FIG. 9C shows that a more irregular structure than FIG. 9B does not yield appreciably different results. FIG. 9D shows a fourth example pattern to the left and a similar example corresponding log likelihood estimate between τ and σ. Like in FIGS. 9B and 9C, the contour lines are much more sharpened than in FIG. 9A and strongly converge on a particular value of the log likelihood of each parameter. FIG. 9D shows that a highly complex structure does not yield appreciably different results. And, so a relatively simply regular structure of FIG. 9B or a relatively simple irregular structure of FIG. 9C can yield good results.

FIGS. 10A, 10B, 10C, 10D and 10E show examples of covariance of model parameters for different design patterns. FIG. 10A shows a first example pattern at the top and an example corresponding covariance between τ (along the vertical axis) and σ (along the horizontal axis) from equation (3) (which incorporates equations (1) and (2)). As seen in FIG. 10A, the values are quite spread out and do not strongly converge on a particular value. Thus, the design pattern of FIG. 10A is not a good candidate design pattern for evaluation of the parameters of the model. FIG. 10B shows a second example pattern to the top and a similar example corresponding covariance between τ and σ. As seen in FIG. 10B, the values have converged more but there is quite some variability. Thus, the design pattern of FIG. 10B is likely not a good candidate design pattern for evaluation of the parameters of the model. FIG. 10C shows a third example pattern to the top and a similar example corresponding covariance between τ and σ. As seen in FIG. 10C, the values have fairly strongly converged. Thus, the design pattern of FIG. 10C is likely a good candidate design pattern for evaluation of the parameters of the model. FIG. 10D shows a fourth example pattern to the top and a similar example corresponding covariance between τ and σ. As seen in FIG. 10D, the values have fairly strongly converged. Thus, the design pattern of FIG. 10D is likely a good candidate design pattern for evaluation of the parameters of the model. Moreover, it can be seen that a regular design pattern can yield the same or similar results as an irregular structure such as in FIG. 10C. FIG. 10E shows a fifth example pattern to the top and a similar example corresponding covariance between τ and σ. As seen in FIG. 10E, the values have fairly strongly converged. Thus, the design pattern of FIG. 10E is likely a good candidate design pattern for evaluation of the parameters of the model. However, this highly complex pattern does not yield significantly better results than a simpler regular structure such as in FIG. 10D or a simpler irregular structure such as in FIG. 10C.

Now, having the model and an estimate of the model parameters, the model's output prediction may mismatch with observed reality. This can be caused by disturbances that can have various sources, such as model mismatch, parameter drift, processing apparatus offsets, etc.

So, in an embodiment, in a closed-loop system, the state of the system is adjusted such that these disturbances can be rejected. In an embodiment, there can be provided a closed-loop state estimation process.

In an embodiment, a state estimator (e.g., as provided at 430 of FIG. 4) can estimate a state 2 such that the predicted output 2 (e.g., as provided from 410 of FIG. 4) matches a measured output $z^m$ (e.g., at 420 of FIG. 4). In an embodiment, the estimate is continually and recursively updated as further measurements of the patterning process come in; so, the estimates track the state of the system.

In an embodiment, the state estimate is recursively updated using a Bayesian formulation. According to Bayes' theorem, $$\text{posterior} = \frac{\text{likelihood} \times \text{prior}}{\text{normalization}} \quad (14)$$

So, extending this to the model and its set of parameters described above, the Bayesian formulation of the recursive updating of the parameters can take the following form:

$$P(\theta \mid z^m) = \frac{P(z^m \mid \theta)P(\theta)}{P(z^m)} \quad (15)$$

wherein P is the mathematical model that determines the probability of the creation (or not) of a portion of the physical structure (such as the model of equations (3), (4), (8), (9), (10), etc.), θ is the set of parameters of the function P, $z^m$ is a measured image, P(θ) is the prior distribution of the set of parameters θ, P($z^m$|θ) is the likelihood of the set of parameters θ for all pixels of the measured image $z^m$, P($z^m$) normalizes the cumulative probability to 1, and P(θ|$z^m$) is the posterior distribution of the set of parameters θ given the measured image $z^m$. So, the state estimation determines the posterior probability P(θ|$z^m$) of the state of the set of parameters θ given the latest measurement. Any one or more techniques can be used to determine this posterior probability including: Kalman filtering, extended Kalman filtering, particle filtering, sequential Monte Carlo, moving horizon estimation, etc. The state estimation can allow for accurate model predictions, but the states can also be explicitly monitored.

Further, in an embodiment, the machine learning technique of boosting is used in combination with mathematical models that model a derived image feature of the design pattern to obtain a combination (e.g., additive) model that can be used in patterning process design, control, modification, etc. In an embodiment, the combination model is a combination of a plurality of classifier models that are, e.g., added together. In an embodiment, the boosting is performed based on pixel-level data predicted by the mathematical models.

In an embodiment, the boosting method starts that from the premise that a design pattern as implemented by a patterning device is used for exposure and results in an exposed pattern. This resulting pattern can be measured with a suitable inspection apparatus (e.g., a SEM). This measured image can be segmented into discrete values (e.g., a binary image) to form a derived image for analysis. The description that follows focuses on models that work from and/or output a binary image, but the boosting method here is not limited to binary classification.

So, it is desired to model the relation between the design pattern and the derived image. Thus, the design pattern is the input of the model, and the derived image is a desired output.

To enable this, a plurality of derived image features (and their associated models) is used as part of the boosting method to obtain the model.

Figure 11A:
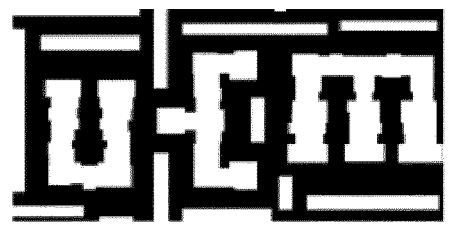
FIG. 11A shows a schematic example of a design pattern.

Referring to FIG. 11A, a schematic example of a design pattern is depicted. In this case, the design pattern corresponds to a patterning device (e.g., mask) pattern. However, the design pattern can be a different pattern (e.g., the desired pattern of a device) provided, in this example, it can be used to obtain the derived image feature.

Figure 11B:
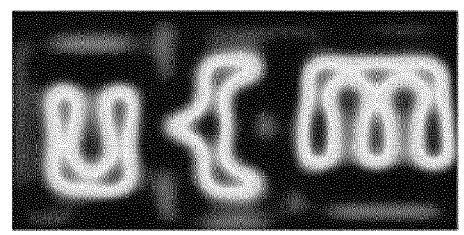
FIGS. 11B, 11C and 11D show schematic examples of corresponding derived image features, namely blur, strain and curvature.
Figure 11C:
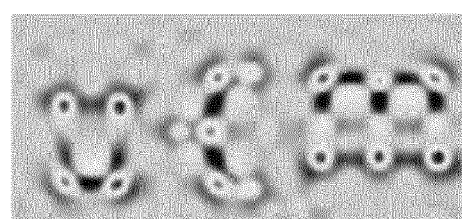
Figure 11D:
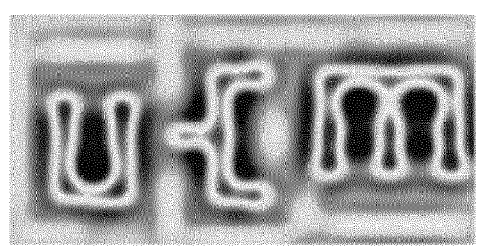

FIG. 11B shows a schematic example of a derived image feature corresponding to the design pattern of FIG. 11A. In the case of FIG. 11B, it is blur, which has been described above. Thus, FIG. 11B can represent an expected aerial image of the design pattern in a lithographic step of the patterning process. FIG. 11C shows a schematic example of a further derived image feature corresponding to the design pattern of FIG. 11A, namely strain as described above, and FIG. 11D shows a schematic example of a further derived image feature corresponding to the design pattern of FIG. 11A, namely curvature. Not all of these (or any of these) derived image features need to be used in the boosting method described herein. Moreover, less than all of these derived image features can be used in the boosting method described herein.

Figure 11E:
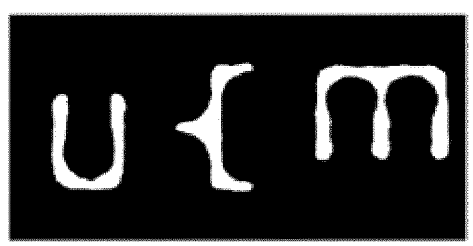
FIG. 11E shows a schematic example of a binarized measured image of the exposed pattern corresponding to the design pattern.

FIG. 11E shows a schematic example of a binarized measured image of the exposed pattern corresponding to the design pattern. Thus, FIG. 11E represents an output of patterning process using the design pattern of FIG. 11A as an input.

So, in an embodiment, given a design pattern, a plurality of derived image (input) features can defined. For example, the derived image features can be two or more selected from: blur, strain, curvature, and/or any combination thereof. These derived image features can be generalized as derived image features $F_1$, $F_2$, $F_3$, etc. While the focus on derived image features herein has been and will be on two-dimensional derived image features, one or more of the derived image features can be a three-dimensional derived image feature that considers the design pattern features in a third dimension.

Figure 12:
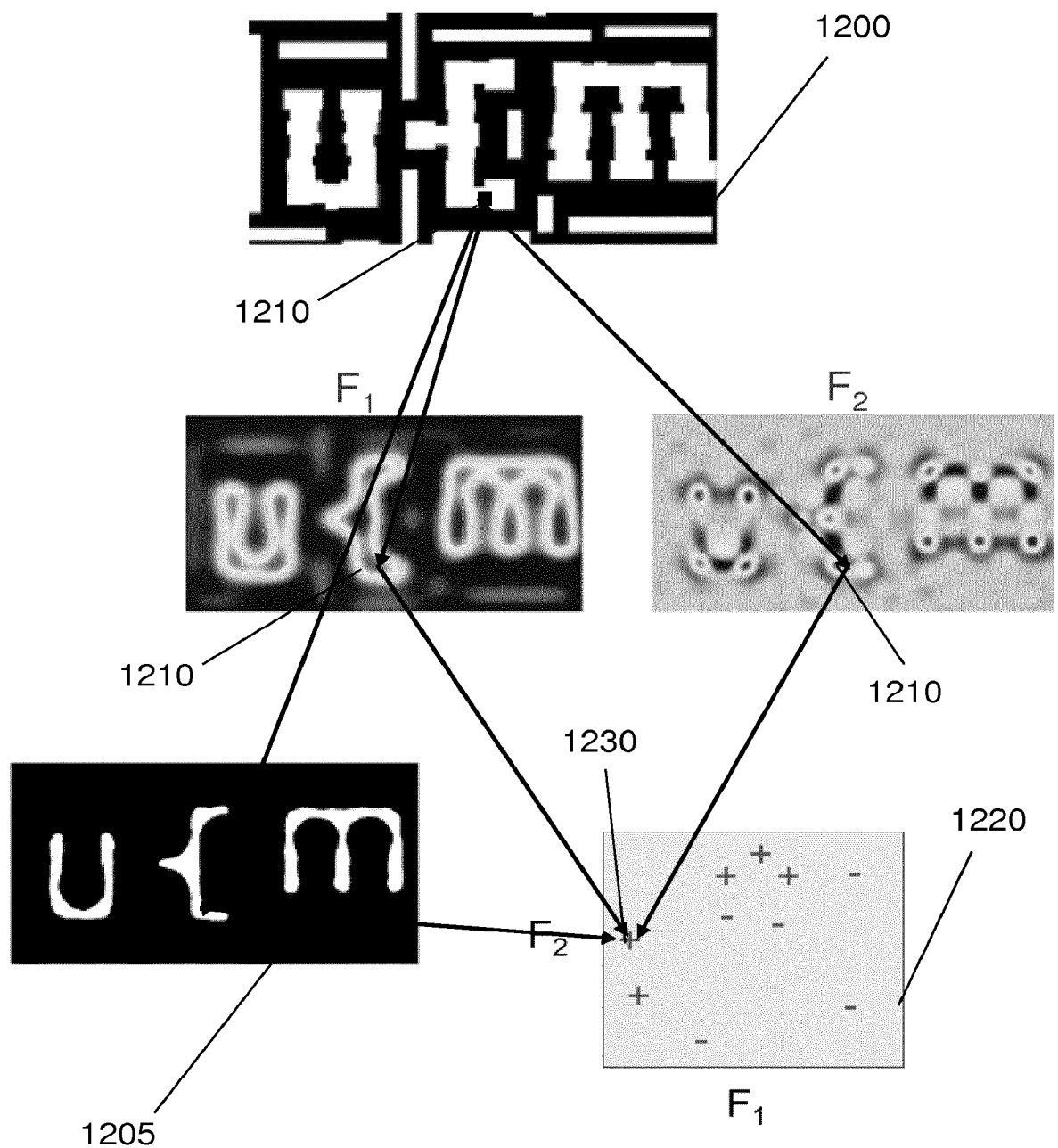
FIG. 12 depicts a schematic example of classifying parts of the design pattern according to a plurality of derived image features.

FIG. 12 depicts a schematic example of classifying parts of the design pattern image according to a plurality of derived image features. In this example, there is used a design pattern 1200 and two corresponding derived image features $F_1$ and $F_2$. For example, $F_1$ can be blur derived from the design pattern 1200, while $F_2$ can be strain derived from the design pattern 1200.

Having the derived image features $F_1$ and $F_2$, a corresponding pixel 1210 in each of the measured image 1205 and derived image features $F_1$ and $F_2$ can be evaluated to obtain respective values. In this example, the measured image 1205 is binarized, that is each pixel is one of two values (0,1), (−, +), etc. In this example, the label (−, +) will be used with the "−" corresponding to black in the image 1205 and "+" corresponding to white in the image 1205. The image 1205 need not be binarized and the label need not have just two values.

So, for pixel 1210, in the image 1205, there is a value of "+". Further, for the corresponding pixel 1210 in derived image features $F_1$ and $F_2$, there are 2 corresponding derived image feature values $f_1$, $f_2$. These can be combined together as shown in 1220 as a labelled tuple 1230 of values, wherein the vertical axis of the graph corresponds to the value of derived image feature $F_1$ and the horizontal axis corresponds to the value of derived image feature $F_2$. In this graph, the tuple 1230 corresponds to the derived image feature values $f_1$, $f_2$ of pixel 1210 along with the label of pixel 1210, i.e., "+". This analysis can be repeated for a plurality of corresponding pixels (e.g., all or substantially all) of the design pattern 1200 and corresponding derived image features $F_1$ and $F_2$ and measured image 1205. The results can be a collection of tuples as shown in 1220 for the pixels of the design pattern 1200.

Now, a plurality of classifier models can be determined based on the labelled tuples. In particular, in an embodiment, each of the classifier models can be parameterized based on the labelled tuples. In an embodiment, a subsequent classifier model is parameterized based on the results of an earlier parameterization of a classifier model. In an embodiment, a previous parameterization can cause a different weight to be applied between correctly classified tuples and misclassified tuples. For example, misclassified tuples can be provided a higher weight than other tuples during a parameterization of a classifier model. The result will be a plurality of parameterized classifier models.

So, in a basic example, there can be used a model class of decision trees of a depth of 1 (also called a stump). Thus, a model from this model class will be a decision tree with a specific choice for the parameter(s). But, as will be appreciated, the model class can be of different kinds of models. The model class can be more complex decision trees than decision trees of a depth of 1. The model class can be a different kind of model than a decision tree. For example, the model class can comprise one or more kinds of the logistic model described herein.

Figure 13:
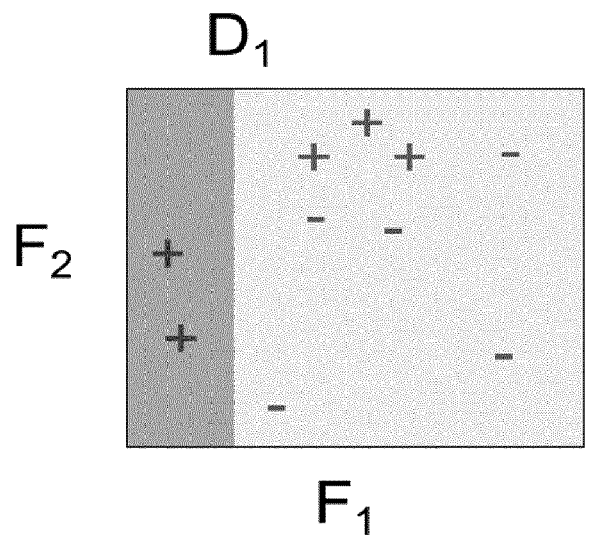
FIG. 13 depicts a schematic example of determining a first classifier model.

So, referring to FIG. 13, a schematic example of a first classifier model is presented. Here, the model has the form of:

$$y = \begin{cases} 0 \text{ if } F_1 > D_1 \\ 1 \text{ else} \end{cases} \tag{16}$$

where the value 0 corresponds to "−" in a tuple and the value 1 corresponds to "+" in a tuple. While this classifier model evaluates $F_1$, it could instead, for example, evaluate $F_2$ or a combination of $F_1$ and $F_2$. This first classifier model is applied to the labelled tuples of 1220. Concretely, given this dataset, the tuples 1220 are split on $F_1$ at a specific value $D_1$. For example, the model is used to classify the tuples 1220 to find a value of $D_1$ that, e.g., maximizes the number of correctly classified tuples 1220 or minimizes the number of misclassified tuples 1220. In the context of a different kind of model, the analysis can be used to derive a set θ of parameters of a model, such one of the logistic models described above. In an embodiment, the cost function used in classification aims to derive a best fit set θ of parameters of the model.

So, in the example of FIG. 13, it can be seen that all tuples 1220 with a value of $F_1$ less than or equal to $D_1$ are "+" tuples, while a large percentage of the tuples 1220 with a value of $F_1$ greater than $D_1$ are "−" tuples. But, as can be seen, this first classifier model does not perform perfectly (i.e., some tuples 1220, which correspond to certain pixels, are misclassified) and leaves some residual classification error.

Figure 14:
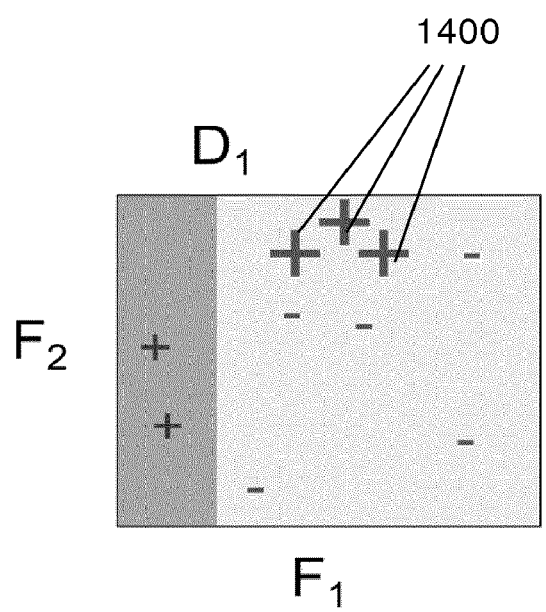
FIG. 14 depicts a schematic example of processing a classification residual.

FIG. 14 depicts a schematic example of the classification residual. That is, the results of the classification of FIG. 13 leaves incorrectly classified tuples 1400. So, in an embodiment, the tuples 1220 are weighted so that tuples 1400 are increased in their importance in subsequent classification. In an embodiment, this can be done by increasing a weight of the tuples 1440 relative to the other correctly classified tuples. The difference in weighting of tuples 1400 relative to the other tuples is shown by the larger "+" tuples 1400; of course, the weighting itself is some value attached to the tuples 1400 to enable use in evaluating a cost function to determine a subsequent classifier model. This new, weighted set of tuples 1220 forms the dataset for evaluating a second classifier model.

Figure 15:
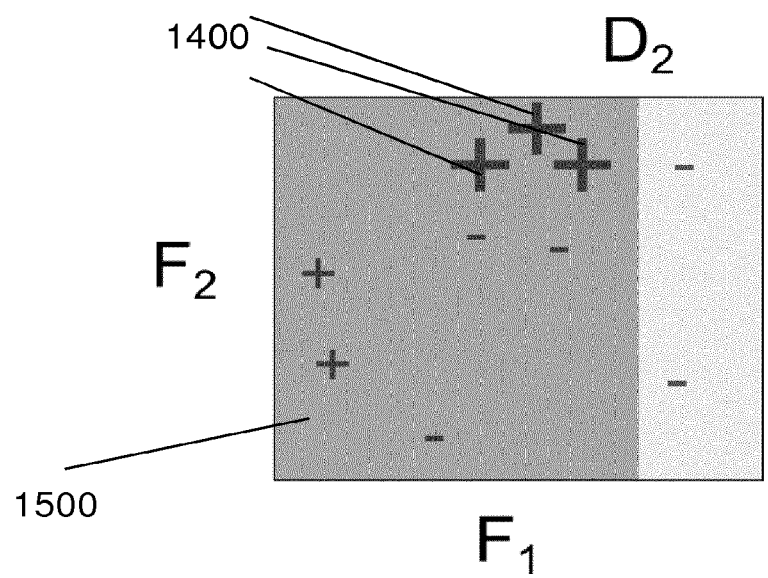
FIG. 15 depicts a schematic example of determining a second classifier model.

FIG. 15 depicts a schematic example of determining a second classifier model. In particular, given the weighted dataset from FIG. 14, a new second classifier model can be learned. Here, the model has the form of:

$$y = \begin{cases} 0 \text{ if } F_1 > D_2 \\ 1 \text{ else} \end{cases} \tag{17}$$

where the value 0 corresponds to "−" in a tuple and the value 1 corresponds to "+" in a tuple. While this second classifier model evaluates $F_1$ again, it could instead, for example, evaluate $F_2$ or a combination of $F_1$ and $F_2$. This second classifier model is applied to the weighted tuples 1220 of FIG. 14. Concretely, given this dataset, the tuples 1220 are split on $F_1$ at a specific value $D_2$. For example, the model is used to classify the tuples 1220 to find a value of $D_2$ that, e.g., minimizes or maximizes a cost function regarding the correct or incorrect classification of the tuples. But, in this case, certain tuples are weighted differently than other tuples, which affects how the cost function is evaluated and therefore the determination of the value of $D_2$. So, in the example of FIG. 15, it can be seen that all tuples 1220 with a value of $F_1$ greater than or equal to $D_2$ are "−" tuples, while a large percentage of the tuples 1220 with a value of $F_1$ less than or equal to $D_2$ are "+" tuples. Thus, this second classifier model aims at fitting the misclassified data better due to the weighting.

The classification could stop at this point, particularly if the second classifier model correctly classifies all the data. But, as can be seen, this second classifier model still does not perform perfectly (i.e., some tuples 1220, which correspond to certain pixels, are misclassified) and so there is still some residual classification error in this example. For example, the "−" tuples in the region 1500 are misclassified. So, like with the example of FIG. 14, the tuples in the new weighted set can be re-weighted to form a further new weighted set of tuples 1220. That is, in an embodiment, the tuples 1220 are weighted so that misclassified tuples from determining the second classifier model are increased in their importance in subsequent classification. In an embodiment, this can be done by increasing a weight of the misclassified tuples relative to other correctly classified tuples. This is shown as the larger "−" tuples 1620 in 1610 of FIG. 16. Further, previously misclassified tuples that are now correctly classified can have their weighting reduced. This is shown as the smaller "+" tuples 1400 in 1610 of FIG. 16. Further, previously properly classified tuples that are now correctly classified again can have their weighting reduced. This is shown as the smaller "−" tuples 1625 in 1610 of FIG. 16 and the smaller "+" tuples 1630 in 1610 of FIG. 16. This new weighted set of tuples 1220 forms the dataset for evaluating a third classifier model. This classification using a further classifier model and weighting a residual can be repeated a number of times.

Figure 16:
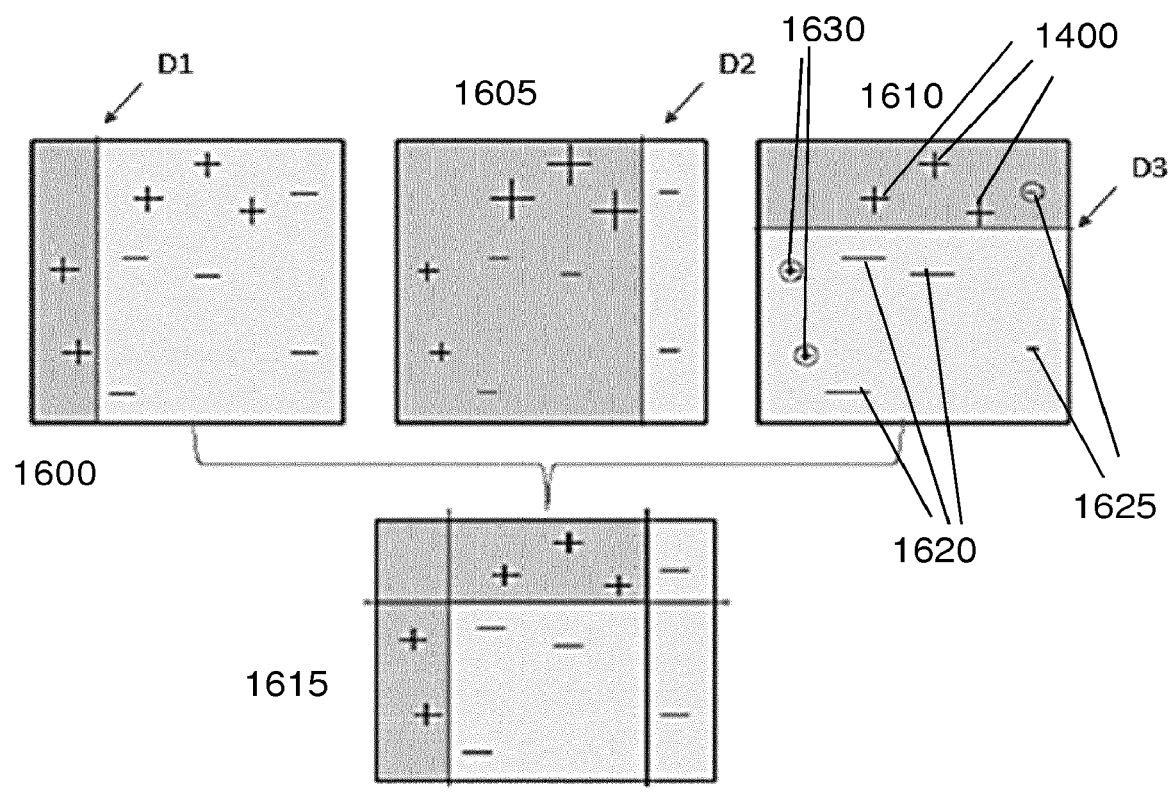
FIG. 16 depicts a schematic example of combining the classifier models into a combination model.

Now, FIG. 16 depicts a schematic example of a combination of classifier models to form a combination model, which can then be used like, for example, a logistic model described earlier to predict how a design pattern will turn into a realized pattern on a substrate. For example, the combination model can be a collection (or ensemble) of the classifier models, such as discussed above. The combination model can be combined into a stronger classifier model than the individual classifier models. In an embodiment, the combination model can be a combination of logistic models (as the classifier models). In an embodiment, the combination model is an additive model comprising the additive combination of the classifier models.

So, FIG. 16 schematically shows the first classifier model obtained at FIG. 13 as classifier model 1600. Further, FIG. 16 shows the second classifier model obtained at FIG. 15 as classifier model 1605. Further, FIG. 16 shows a third classifier model 1610 using the new weighted data set obtained after determining the model in FIG. 15. The model for the third classifier model can be of the form:

$$y = \begin{cases} 0 \text{ if } F_2 < D_3 \\ 1 \text{ else} \end{cases} \quad (18)$$

where the value 0 corresponds to "−" in a tuple and the value 1 corresponds to "+" in a tuple. The three classifier models are then combined into a combination model 1615 as schematically depicted in FIG. 16. In an embodiment, the number of classifier models is 2 or more, 3 or more, 4 or more, 5 or more, 10 or more, or 20 or more.

In an embodiment, the combination model can be denoted as model C(x), where x corresponds to each pixel. For each pixel (x), each classifier i predicts its label $k_i(x)$. So, to obtain the combination model, the classifiers can be weighted by a weight $\alpha_i$ to yield weighted $\alpha_i k_i(x)$. As will be appreciated, these weights are different than the weights discussed above used in obtaining the classifier models. Then, the resulting combination model can be n classifiers added together according to their weights, resulting in:

$$C(x) = \alpha_1 k_1(x) + \ldots + \alpha_n k_n(x) \quad (19)$$

As a simple example, each weight $\alpha_i$ can be 1/n.

Having the model (e.g., a logistic model, a combination model, etc.) and its parameters and referring to FIG. 4, the model can then be used to change, design, regulate, etc. 440 a parameter/variable of the patterning process toward a target 450. For example, given the model parameters and/or the model state estimate 430, an optimization problem can be solved that determines one or more inputs 400 such that a model prediction realizes a defined target 450. In an embodiment, the optimization can utilize a model that is being regularly updated as measurements of physical structures come in. The regulation can be done in various manners. For example, in an embodiment, one or more optimal apparatus (e.g., lithographic apparatus) settings, such as focus and/or dose, are manipulated. This can be done relatively quickly and in conjunction with execution of the patterning process (e.g., between exposures or between lots of substrates). In an embodiment, one or more optimal illumination mode settings (e.g., angular or spatial distribution characteristics) can be determined. Those settings can be changed, e.g., between different lots of substrates. In an embodiment, one or more characteristics of the design pattern (e.g., addition of optical proximity features such as assist features, feature bias, serifs, etc.) can be changed. In an embodiment, the patterning process parameter comprises one or more selected from: focus, exposure dose, numerical aperture, a film stack property, projection system optical aberration, radiation coherence, illumination intensity distribution, position in an image field, and/or position on a substrate.

Further, the model can be used to identify a defect in processing of the design pattern by a patterning process. For example, the model can identify a CD that doesn't meet or cross a defined threshold. If so, the patterning process can be stopped, the substrate at issue reworked, etc.

So, the model and/or model prediction system can be used for defect detection (and appropriate action in response thereto), model identification, existing model calibration, defect classification, defect estimation, process monitoring, process control, process design, design pattern design, etc.

Figure 17:
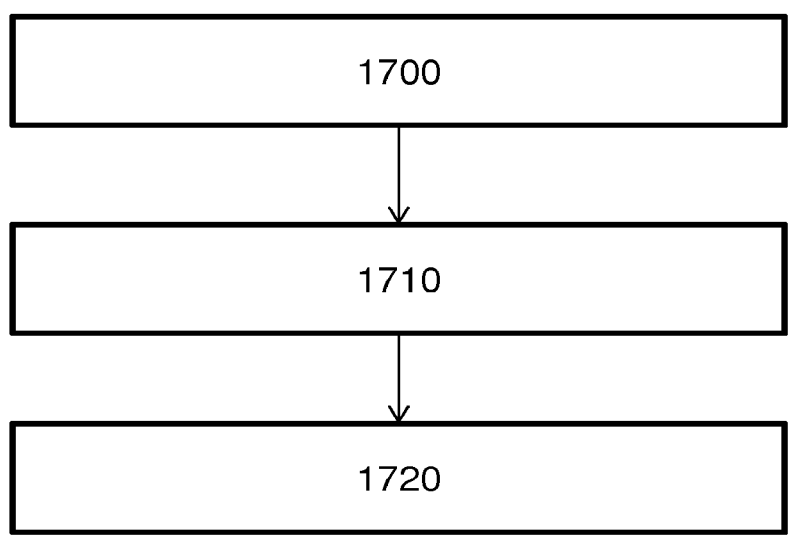
FIG. 17 depicts a process of defect detection, model identification, existing model calibration, defect classification, defect estimation, process monitoring, process control, process design, design pattern design, etc., based on a model and/or model prediction system as described herein.

FIG. 17 depicts an example process of defect detection, model identification, existing model calibration, defect classification, defect estimation, process monitoring, process control, process design, design pattern design, etc. based on a model and/or model prediction system as described herein.

At 1700, a plurality of images, or derived representations of the images of a structure created by a patterning process are obtained, e.g., at different values of a patterning process parameter. In an embodiment, the derived representations comprise binary representations determined from measured images of the structure. In an embodiment, the patterning process parameter comprises one or more selected from: focus, exposure dose, numerical aperture, a film stack property, projection system optical aberration, radiation coherence, illumination intensity distribution, position in an image field, and/or position on a substrate. In an embodiment, the structure comprises a circuit feature of an integrated circuit. In an embodiment, the images are scanning electron microscope images.

Further, a model is identified that predicts the formation of a physical structure created using the patterning process. In an embodiment, the model comprises a logistic mathematical model predicting the formation of a physical structure created using the patterning process.

At 1710, the images or derived representations are analyzed, by a computer processor, to parameterize the model. In an embodiment, estimates of the parameters of the model are determined by analyzing pixels of an image or a derived representation as individual outcomes. Optionally, a state estimation process is performed to update the model parameters in conjunction with execution of the patterning process.

At 1720, an output of the model is used for defect detection, model identification, existing model calibration, defect classification, defect estimation, process monitoring, process control, process design, design pattern design, etc. A defect may include thinning or necking (e.g., line thinning or necking), bridging or shorting, an opening or disconnect, pullback (e.g., line end pullback), etc. In an embodiment, one or more inputs to the patterning process can be changed, designed, etc. based on the output of the model and then the patterning process can be executed (e.g., again) with the new one or more inputs to yield a processed physical structure whose image (or derived representation) can be used to update the parameters of the model, and so on.

In an embodiment, the model parameterization and/or state estimation can be supplemented by other data, such as electrical test results, optical diffraction based measurement results, etc.

So, once the model is obtained for physical structures in a particular patterning process, the model may then enable relatively accurate prediction of device defects, device yield, etc. as a function of one or more input parameters of the patterning process, such as focus, dose, an etch setting, etc.

So, for example, the model for the patterning process can enable, e.g., prediction of whether a structure will likely be defective depending on certain values of one or more patterning process parameters. In an embodiment, the model can then be used as part of a process control strategy (e.g., to change a parameter of the patterning process (e.g., focus, dose, an etch setting, etc.) on the basis of the output of the model), designate or categorize formed structures expected to be defective, etc.

Thus, the techniques described herein enable defect detection, model identification, existing model calibration, defect classification, defect estimation, process monitoring, process control, process design, design pattern design, etc. from review of images. And, from such review of images, such as the individual pixels of the images as independent outcomes, a model can be created from these images for the patterning process, the model identifying, for example, the effectiveness of formation of a part of a device according to one or more patterning process parameters.

The model may be used against measured structures of, e.g., production created patterned structures. For example, the model may be used to predict certain parameter values (e.g., particular widths) of certain structures and then one or more production created versions of the patterned structures may be measured using, for example, a scatterometer for comparison with the prediction. If the measurement and the prediction sufficiently match then the structure may be deemed "good". Otherwise, the structure may be reprocessed or scrapped. Further, the data from the comparison may be fed back into the predictive analysis (as data to establish correlations, update model parameters, etc.) and may be used to effect a change in the process (e.g., an insufficient match between the measurement and the prediction (that, for example, occurs a certain number of times) may be an indicator of a need for a change in the process).

So, current computational patterning process models rely on many parameters in order to make a correct prediction. Such existing models can be complex and burdensome and can be hard to identify; as a result, they often don't predict product structures in production very well. They can also be too cumbersome for optimization purposes. The techniques herein can enable a relatively simple model (e.g., a logistic model) that can accurately predict physical structure formation.

Further, current approaches aim at matching simulated contours to contours extracted from images, relying on deviation of the contours to identify parameters of a model. The contouring inherently introduced inaccuracy. Further, models can be identified with measurement gauges. But, these are not the product structures per se, and so a model derived from measurement gauge can be inherently disconnected from the patterning process. The techniques herein of evaluating pixels of images can enable robust and accurate model parameter and/or model state estimation.

So, in an embodiment, pixels in an image (e.g., an electron beam or SEM image) are treated as conditionally independent of a common parameter. So, to this end, image data as measured by a SEM or other tool can be processed into a pixelated form (e.g., a binary or gray level image). A logistic model (e.g., for a part of the patterning process, such as a lithographic model to arrive at a resist image or structure, or an etch model to arrive at a post-etch structure) is proposed that calculates the probability of a pixel being a certain level (e.g., binary or grey level). This logistic model is a function of parameters. In an embodiment, the parameters are estimated via analysis of images of physical structures made by the patterning process. For example, the parameters are by evaluating the individual pixels as individual outcomes for estimating the parameters.

The logistic model has one or more descriptive features that can be regressed to. Such features capture the behavior of the process. In an embodiment, the features can include aerial image blur, aerial image curvature, and/or aerial image strain.

As noted above, given a measured image of a physical structure, the logistic model can be identified as a function of one or more the descriptive features (e.g., aerial image blur, aerial image curvature) and its parameters. Using this learned model, one or more parameters (e.g., shape, CD, etc.) of a physical structure as produced by the modeled patterning process can be predicted given the design pattern.

In an embodiment, one or more known patterning process input parameters, such as focus, dose, substrate position, one or more illumination conditions, one or more etch conditions, etc. can be regressed to in the model. Thus, the model can predict the response to these process conditions.

The result is that, in an embodiment, there is provided a relatively simple model that can be quickly deployed in, e.g., a production environment. In an embodiment, the model can be recursively updated (e.g., based on measurements during production) in order to monitor and control physical structures obtained during production and consequently yield.

In an embodiment, the model can be relatively easily inverted for design pattern modification and/or other optimization problems, such as lithographic apparatus and/or etch tool regulation.

Further, in an embodiment, the model is derived from all the pixels of the complete product structure as compared to a derived contour. Since the model is identified with physical structures, the model can directly predict the behavior of the patterning process.

In an embodiment, there is provided a method comprising: obtaining a logistic mathematical model predicting the formation of a physical structure created using a patterning process; evaluating, by a hardware computer, the logistic mathematical model to predict formation of a part of the physical structure and generate an output; and adapting, based on the output, an aspect of the patterning process.

In an embodiment, a logistic function of the logistic model has a natural log with an exponent involving 3 or more parameters. In an embodiment, the logistic mathematical model comprises a function of blur of a design pattern during at least part of the patterning process. In an embodiment, the logistic mathematical model comprises a function of the form:

$$\frac{1}{1 + \exp(-\gamma(a - \tau))}$$

wherein $\alpha$ is a function describing an aerial image of a design pattern used to form the physical structure, and $\gamma$ and $\tau$ are parameters specific to the patterning process. In an embodiment, a logistic function of the logistic model has a natural log with an exponent involving 5 or more parameters. In an embodiment, the logistic mathematical model comprises a function of a curvature of an aerial image of the design pattern during at least part of the patterning process. In an embodiment, the logistic mathematical model comprises a function of the form:

$$\frac{1}{1 + e^{-(\theta_2 \cdot |m * h(\theta_1)|^2 + \theta_3 + \theta_5 \cdot C(|m * h(\theta_4)|^2))}}$$

wherein $|m*h(\theta_1)|^2$ is a function describing blur of an aerial image of a design pattern m used to form the physical structure, $C(|m*h(\theta_4)|^2)$ is a function describing curvature of an aerial image of the design pattern m used to form the physical structure, and $\theta_1$, $\theta_2$, $\theta_3$, $\theta_4$, and $\theta_5$ are parameters specific to the patterning process. In an embodiment, the evaluating comprising evaluating a combination model comprising a combination of a plurality of classifier models including the logistic mathematical model. In an embodiment, the obtaining comprises performing a boosting machine learning technique involving the logistic mathematical model to obtain the combination model. In an embodiment, the logistic model predicts a post-development but pre-etch formation of the part of the physical structure in a resist on a substrate. In an embodiment, the logistic model predicts a post-etch formation of the part of the physical structure on a substrate. In an embodiment, the adapting comprises designing a part of the patterning process. In an embodiment, the adapting comprises adjusting a process variable of the patterning process. In an embodiment, the patterning process variable comprises one or more selected from: focus, exposure dose, numerical aperture, a film stack property, projection system optical aberration, radiation coherence, illumination intensity distribution, position in an image field, and/or position on a substrate. In an embodiment, the physical structure comprises a circuit feature of an integrated circuit.

In an embodiment, there is provided a method comprising: obtaining a measured image of a physical structure created using a patterning process; and using, by a hardware computer, individual pixels of the image as independent outcomes to parameterize a mathematical model predicting the formation of a part of a physical structure created using the patterning process.

In an embodiment, the mathematical model predicts a probability of a pixel of a probability map corresponding to the physical structure being a certain value. In an embodiment, the method further comprises determining an estimate of the parameters of the mathematical model that maximizes a likelihood that a predicted value of a pixel equals to a measured value of the pixel from the measured image. In an embodiment, each of the pixels has one of only two values. In an embodiment, the method comprises finding a set of parameters $\theta$ that maximizes: $P(z^m|\theta)P(\theta)=\Pi_i P(z_i=z_i^m|\theta)P(\theta)$ wherein $z_i^m$ is the binary measured value of 0 or 1 of the corresponding pixel i from the measured image, P is a mathematical function describing a probability of a pixel $z_i$ corresponding to a certain value, and $\theta$ is the set of parameters of the function P. In an embodiment, the image is a scanning electron microscope image. In an embodiment, the mathematical model comprises a logistic mathematical model. In an embodiment, a logistic function of the logistic model has a natural log with an exponent involving 3 or more parameters. In an embodiment, the logistic mathematical model comprises a function of blur of a design pattern during at least part of the patterning process. In an embodiment, the logistic mathematical model comprises a function of the form:

$$\frac{1}{1+\exp(-\gamma(a-\tau))}$$

wherein $\alpha$ is a function describing an aerial image of a design pattern used to form the physical structure, and $\gamma$ and $\tau$ are parameters specific to the patterning process. In an embodiment, a logistic function of the logistic model has a natural log with an exponent involving 5 or more parameters. In an embodiment, the logistic mathematical model comprises a function of a curvature of an aerial image of the design pattern during at least part of the patterning process. In an embodiment, the logistic mathematical model comprises a function of the form:

$$\frac{1}{1+e^{-(\theta_2 \cdot |m*h(\theta_1)|^2 + \theta_3 + \theta_5 \cdot C(|m*h(\theta_4)|^2))}}$$

wherein $|m*h(\theta_1)|^2$ is a function describing blur of an aerial image of a design pattern m used to form the physical structure, $C(|m*h(\theta_4)|^2)$ is a function describing curvature of an aerial image of the design pattern m used to form the physical structure, and $\theta_1$, $\theta_2$, $\theta_3$, $\theta_4$, and $\theta_5$ are parameters specific to the patterning process. In an embodiment, using individual pixels of the image as independent outcomes to parameterize the mathematical model comprises performing a boosting machine learning technique based on the independent outcomes to evaluate a plurality of classifier models. In an embodiment, at least one of the classifier models comprises a logistic mathematical model. In an embodiment, the model predicts a post-development but pre-etch formation of the part of the physical structure in a resist on a substrate. In an embodiment, the logistic model predicts a post-etch formation of the part of the physical structure on a substrate. In an embodiment, the method further comprises adapting, based on an output of the mathematical model, an aspect of the patterning process. In an embodiment, the adapting comprises designing a part of the patterning process. In an embodiment, the adapting comprises adjusting a process variable of the patterning process. In an embodiment, the patterning process variable comprises one or more selected from: focus, exposure dose, numerical aperture, a film stack property, projection system optical aberration, radiation coherence, illumination intensity distribution, position in an image field, and/or position on a substrate. In an embodiment, the physical structure comprises a circuit feature of an integrated circuit.

In an embodiment, there is provided a method comprising: obtaining a combination mathematical model comprising a plurality of classifier models determined by a boosting machine learning algorithm, the combination mathematical model predicting formation of a physical structure created using a patterning process; evaluating, by a hardware computer, the combination mathematical model to predict formation of a part of the physical structure and generate an output; and adapting, based on the output, an aspect of the patterning process.

In an embodiment, at least one of the classifier models comprises a logistic mathematical model. In an embodiment, at least one of the classifier models describes blur and/or strain of a design pattern during at least part of the patterning process. In an embodiment, the method further comprises performing the boosting machine learning algorithm to obtain the classifier models, the boosting machine learning algorithm learning using pixel values of a measured image of a physical structure as outcomes. In an embodiment, there is provided a method comprising: obtaining a measured image of a physical structure created using a patterning process; and performing, by a hardware computer, a boosting machine learning algorithm to parameterize a plurality of classifier models, the boosting machine learning algorithm using values of pixels of the measured image as outcomes and a combination of the classifier models predicting the formation of a part of a physical structure created using the patterning process. In an embodiment, at least one of the classifier models comprises a logistic mathematical model. In an embodiment, at least one of the classifier models describes blur and/or strain of a design pattern during at least part of the patterning process. In an embodiment, the method further comprises evaluating the combination mathematical model to predict formation of a part of the physical structure and generate an output; and adapting, based on the output, an aspect of the patterning process.

In an embodiment, the physical structure comprises a circuit feature of an integrated circuit. In an embodiment, the image(s) is a scanning electron microscope image. In an embodiment, the image(s) is obtained with a low-dose scanning electron microscope.

While much of the foregoing description has focused on using binary image processing techniques of data for two-dimensional images, the image processing technique described may be extended to, e.g., gray scale images and/or extended to, e.g., data for three-dimensional images.

The term "value" can be numeric, symbolic, alphabetic, etc. data.

The term "optimize", "optimizing" and "optimization" as used herein refers to or means adjusting a patterning apparatus (e.g., a lithography apparatus), a patterning process, etc. such that results and/or processes have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

An embodiment may include a computer program containing one or more sequences of machine-readable instructions that enable practice of a method as described herein. This computer program may be included, for example, with or within the imaging apparatus of FIG. 3 and/or with or within the control unit LACU of FIG. 2. There may also be provided a data storage medium (e.g., semiconductor memory, magnetic or optical disk) having such a computer program stored therein. Where an existing apparatus, for example of the type shown in FIGS. 1-3, is already in production and/or in use, an embodiment can be implemented by the provision of updated computer program products for causing a processor of the apparatus to perform a method as described herein.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any control system described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according to the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The embodiments may further be described using the following clauses:

1. A method comprising:

obtaining a logistic mathematical model predicting the formation of a physical structure created using a patterning process;

evaluating, by a hardware computer, the logistic mathematical model to predict formation of a part of the physical structure and generate an output; and adapting, based on the output, an aspect of the patterning process.

2. The method of clause 1, wherein a logistic function of the logistic model has a natural log with an exponent involving 3 or more parameters.
3. The method of clause 1 or clause 2, wherein the logistic mathematical model comprises a function of blur of a design pattern during at least part of the patterning process.
4. The method of any of clauses 1-3, wherein the logistic mathematical model comprises a function of the form:

$$\frac{1}{1+\exp(-\gamma(a-\tau))}$$

wherein $\alpha$ is a function describing an aerial image of a design pattern used to form the physical structure, and $\gamma$ and $\tau$ are parameters specific to the patterning process.
5. The method of any of clauses 1-4, wherein a logistic function of the logistic model has a natural log with an exponent involving 5 or more parameters.
6. The method of any of clauses 1-5, wherein the logistic mathematical model comprises a function of a curvature of an aerial image of the design pattern during at least part of the patterning process.
7. The method of any of clauses 1-6, wherein the logistic mathematical model comprises a function of the form:

$$\frac{1}{1+e^{-(\theta_2 \cdot |m*h(\theta_1)|^2 + \theta_3 + \theta_5 \cdot C(|m*h(\theta_4)|^2))}}$$

wherein $|m*h(\theta_1)|^2$ is a function describing blur of an aerial image of a design pattern m used to form the physical structure, $C(|m*h(\theta_4)|^2)$ is a function describing curvature of an aerial image of the design pattern m used to form the physical structure, and $\theta_1$, $\theta_2$, $\theta_3$, $\theta_4$, and $\theta_5$ are parameters specific to the patterning process.
8. The method of any of clauses 1-7, wherein the evaluating comprising evaluating a combination model comprising a combination of a plurality of classifier models including the logistic mathematical model.
9. The method of clause 8, wherein the obtaining comprises performing a boosting machine learning technique involving the logistic mathematical model to obtain the combination model.
10. The method of any of clauses 1-9, wherein the logistic model predicts a post-development but pre-etch formation of the part of the physical structure in a resist on a substrate.
11. The method of any of clauses 1-9, wherein the logistic model predicts a post-etch formation of the part of the physical structure on a substrate.
12. The method of any of clauses 1-11, wherein the adapting comprises designing a part of the patterning process.
13. The method of any of clauses 1-12, wherein the adapting comprises adjusting a process variable of the patterning process.
14. The method of clause 13, wherein the patterning process variable comprises one or more selected from: focus, exposure dose, numerical aperture, a film stack property, projection system optical aberration, radiation coherence, illumination intensity distribution, position in an image field, and/or position on a substrate.
15. The method of any of clauses 1-14, wherein the physical structure comprises a circuit feature of an integrated circuit.
16. A method comprising:
    obtaining a measured image of a physical structure created using a patterning process; and
    using, by a hardware computer, individual pixels of the image as independent outcomes to parameterize a mathematical model predicting the formation of a part of a physical structure created using the patterning process.
17. The method of clause 16, wherein the mathematical model predicts a probability of a pixel of a probability map corresponding to the physical structure being a certain value.
18. The method of clause 17, further comprising determining an estimate of the parameters of the mathematical model that maximizes a likelihood that a predicted value of a pixel equals to a measured value of the pixel from the measured image.
19. The method of any of clauses 16-18, wherein each of the pixels has one of only two values.
20. The method of any of clauses 16-19, comprising finding a set of parameters $\theta$ that maximizes:

$$P(z^m | \theta)P(\theta) = \prod_i P(z_i = z_i^m | \theta)P(\theta)$$

wherein $z_i^m$ is the binary measured value of 0 or 1 of the corresponding pixel i from the measured image, P is a mathematical function describing a probability of a pixel $z_i$ corresponding to a certain value, and $\theta$ is the set of parameters of the function P.
21. The method of any of clauses 16-20, wherein the image is a scanning electron microscope image.
22. The method of any of clauses 16-21, wherein the mathematical model comprises a logistic mathematical model.
23. The method of clause 22, wherein a logistic function of the logistic model has a natural log with an exponent involving 3 or more parameters.
24. The method of clause 22 or clause 23, wherein the logistic mathematical model comprises a function of blur of a design pattern during at least part of the patterning process.
25. The method of any of clauses 22-24, wherein the logistic mathematical model comprises a function of the form:

$1/1+\exp(-\gamma(\alpha-\tau))$ wherein $\alpha$ is a function describing an aerial image of a design pattern used to form the physical structure, and $\gamma$ and $\tau$ are parameters specific to the patterning process.
26. The method of any of clauses 22-25, wherein a logistic function of the logistic model has a natural log with an exponent involving 5 or more parameters.
27. The method of any of clauses 22-26, wherein the logistic mathematical model comprises a function of a curvature of an aerial image of the design pattern during at least part of the patterning process.
28. The method of any of clauses 22-27, wherein the logistic mathematical model comprises a function of the form:

$$\frac{1}{1+e^{-(\theta_2 \cdot |m*h(\theta_1)|^2 + \theta_3 + \theta_5 \cdot C(|m*h(\theta_4)|^2))}}$$

wherein $|m*h(\theta_1)|^2$ is a function describing blur of an aerial image of a design pattern m used to form the physical structure, $C(|m*h(\theta_4)|^2)$ is a function describing curvature of an aerial image of the design pattern m used to form the physical structure, and $\theta_1$, $\theta_2$, $\theta_3$, $\theta_4$, and $\theta_5$ are parameters specific to the patterning process.
29. The method of any of clauses 16-28, wherein using individual pixels of the image as independent outcomes to parameterize the mathematical model comprises performing a boosting machine learning technique based on the independent outcomes to evaluate a plurality of classifier models.

30. The method of clause 29, wherein at least one of the classifier models comprises a logistic mathematical model.

31. The method of any of clauses 16-30, wherein the model predicts a post-development but pre-etch formation of the part of the physical structure in a resist on a substrate.

32. The method of any of clauses 16-30, wherein the logistic model predicts a post-etch formation of the part of the physical structure on a substrate.

33. The method of any of clauses 16-28, further comprising adapting, based on an output of the mathematical model, an aspect of the patterning process.

34. The method of clause 33, wherein the adapting comprises designing a part of the patterning process.

35. The method of clause 33 or clause 34, wherein the adapting comprises adjusting a process variable of the patterning process.

36. The method of clause 35, wherein the patterning process variable comprises one or more selected from: focus, exposure dose, numerical aperture, a film stack property, projection system optical aberration, radiation coherence, illumination intensity distribution, position in an image field, and/or position on a substrate.

37. The method of any of clauses 16-36, wherein the physical structure comprises a circuit feature of an integrated circuit.

38. A method comprising:
    obtaining a combination mathematical model comprising a plurality of classifier models determined by a boosting machine learning algorithm, the combination mathematical model predicting formation of a physical structure created using a patterning process;
    evaluating, by a hardware computer, the combination mathematical model to predict formation of a part of the physical structure and generate an output; and
    adapting, based on the output, an aspect of the patterning process.

39. The method of clause 38, wherein at least one of the classifier models comprises a logistic mathematical model.

40. The method of clause 38 or clause 39, wherein at least one of the classifier models describes blur and/or strain of a design pattern during at least part of the patterning process.

41. The method of any of clauses 38-40, further comprising performing the boosting machine learning algorithm to obtain the classifier models, the boosting machine learning algorithm learning using pixel values of a measured image of a physical structure as outcomes.

42. A method comprising:
    obtaining a measured image of a physical structure created using a patterning process; and
    performing, by a hardware computer, a boosting machine learning algorithm to parameterize a plurality of classifier models, the boosting machine learning algorithm using values of pixels of the measured image as outcomes and a combination of the classifier models predicting the formation of a part of a physical structure created using the patterning process.

43. The method of clause 42, wherein at least one of the classifier models comprises a logistic mathematical model.

44. The method of clause 42 or clause 43, wherein at least one of the classifier models describes blur and/or strain of a design pattern during at least part of the patterning process.

45. The method of any of clauses 42-44, further comprising evaluating the combination mathematical model to predict formation of a part of the physical structure and generate an output; and adapting, based on the output, an aspect of the patterning process.

46. A method of manufacturing devices wherein a device pattern is applied to a series of substrates using a patterning process, the method including evaluating a patterned structure formed using the patterning process using an output of the mathematical model of the method of any of clauses 1-45 and controlling the patterning process for one or more of the substrates in accordance with the result of the method.

47. The method of clause 46, wherein the patterned structure is formed on at least one of the substrates and controlling the patterning process for later substrates in accordance with the result of the method.

48. A non-transitory computer program product comprising machine-readable instructions configured to cause a processor to cause performance of the method of any of clauses 1-47.

49. A system comprising:
    a scanning electron microscope configured to provide an image of a lithographically created structure; and
    an image analysis engine comprising the non-transitory computer program product of clause 48.

50. The system of clause 49, further comprising a lithographic apparatus comprising a support structure configured to hold a patterning device to modulate a radiation beam and a projection optical system arranged to project the modulated onto a radiation-sensitive substrate.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method comprising:
    obtaining a logistic mathematical model predicting formation of a physical structure created using a patterning process;
    evaluating, by a hardware computer, the logistic mathematical model to predict formation of a part of the physical structure and generate an output; and
    adapting, based on the output, an aspect of the patterning process.

2. The method of claim 1, wherein a logistic function of the logistic model has a natural log with an exponent involving 3 or more parameters.

3. The method of claim 1, wherein the logistic mathematical model comprises a function of blur of a design pattern during at least part of the patterning process.

4. The method of claim 1, wherein a logistic function of the logistic model has a natural log with an exponent involving 5 or more parameters.

5. A method comprising:
obtaining a measured image of a physical structure created using a patterning process; and
using, by a hardware computer, individual pixels of the image as independent outcomes to parameterize a mathematical model predicting the formation of a part of a physical structure created using the patterning process.

6. The method of claim 5, wherein the mathematical model predicts a probability of a pixel of a probability map corresponding to the physical structure being a certain value.

7. The method of claim 6, further comprising determining an estimate of the parameters of the mathematical model that maximizes a likelihood that a predicted value of a pixel equals to a measured value of the pixel from the measured image.

8. A non-transitory computer-readable medium comprising instructions therein, the instructions, upon execution by a computer system, configured to cause the computer system to at least:
obtain a measured image of a physical structure created using a patterning process; and
use individual pixels of the image as independent outcomes to parameterize a mathematical model predicting the formation of a part of a physical structure created using the patterning process.

9. A non-transitory computer-readable medium comprising instructions therein, the instructions, upon execution by a computer system, configured to cause the computer system to at least:
obtain a logistic mathematical model predicting formation of a physical structure created using a patterning process;
evaluate the logistic mathematical model to predict formation of a part of the physical structure and generate an output; and
produce, based on the output, information to adapt an aspect of the patterning process.

10. The computer-readable medium of claim 9, wherein the logistic mathematical model comprises a function of the form:

$$\frac{1}{1 + \exp(-\gamma(a - \tau))}$$

wherein $\alpha$ is a function describing an aerial image of a design pattern used to form the physical structure, and $\gamma$ and $\tau$ are parameters specific to the patterning process.

11. The computer-readable medium of claim 9, wherein the logistic mathematical model comprises a function of a curvature of an aerial image of the design pattern during at least part of the patterning process.

12. The computer-readable medium of claim 9, wherein the logistic mathematical model comprises a function of the form:

$$\frac{1}{1 + e^{-(\theta_2 \cdot |m*h(\theta_1)|^2 + \theta_3 + \theta_5 \cdot C(|m*h(\theta_4)|^2))}}$$

wherein $|m*h(\theta_1)|^2$ is a function describing blur of an aerial image of a design pattern m used to form the physical structure, $C(|m*h(\theta_4)|^2)$ is a function describing curvature of an aerial image of the design pattern m used to form the physical structure, and $\theta_1$, $\theta_2$, $\theta_3$, $\theta_4$, and $\theta_5$ are parameters specific to the patterning process.

13. The computer-readable medium of claim 9, wherein the instructions configured to cause the computer system to evaluate the logistic mathematical model are further configured to cause the computer system to evaluate a combination model comprising a combination of a plurality of classifier models including the logistic mathematical model.

14. The computer-readable medium of claim 9, wherein the logistic model predicts a post-development but pre-etch formation of the part of the physical structure in a resist on a substrate.

15. The computer-readable medium of claim 9, wherein the logistic model predicts a post-etch formation of the part of the physical structure on a substrate.

16. The computer-readable medium of claim 9, wherein the instructions configured to cause the computer system to produce information to adapt an aspect of the patterning process are further configured to cause the computer system to design, based on the information, a part of the patterning process.

17. The computer-readable medium of claim 9, wherein the instructions configured to cause the computer system to produce information to adapt an aspect of the patterning process are further configured to cause the computer system to adjust, based on the information, a process variable of the patterning process, wherein the patterning process variable comprises one or more selected from: focus, exposure dose, numerical aperture, a film stack property, projection system optical aberration, radiation coherence, illumination intensity distribution, position in an image field, and/or position on a substrate.

18. The computer-readable medium of claim 9, wherein a logistic function of the logistic model has a natural log with an exponent involving 3 or more parameters.

19. The computer-readable medium of claim 9, wherein the logistic mathematical model comprises a function of blur of a design pattern during at least part of the patterning process.

20. The computer-readable medium of claim 9, wherein the logistic mathematical model comprises a function of a curvature of an aerial image of the design pattern during at least part of the patterning process.

* * * * *